United States Patent
Suzui et al.

(10) Patent No.: US 7,277,000 B2
(45) Date of Patent: Oct. 2, 2007

(54) INDUCTOR AND TRANSFORMER

(75) Inventors: Masaki Suzui, Tochigi-ken (JP);
Fumitaka Toyomura, Kanagawa-ken (JP)

(73) Assignee: Canon Kabushiki Kaisha, Tokyo (JP)

(*) Notice: Subject to any disclaimer, the term of this patent is extended or adjusted under 35 U.S.C. 154(b) by 73 days.

(21) Appl. No.: 11/108,813

(22) Filed: Apr. 19, 2005

(65) Prior Publication Data

US 2005/0231317 A1 Oct. 20, 2005

(30) Foreign Application Priority Data

Apr. 20, 2004 (JP) ............................. 2004-124564

(51) Int. Cl.
*H01F 27/28* (2006.01)
*H01F 5/00* (2006.01)
(52) U.S. Cl. ...................... 336/182; 336/208; 336/180; 336/200
(58) Field of Classification Search ................ 336/192, 336/208, 180, 182, 198, 200, 232
See application file for complete search history.

(56) References Cited

U.S. PATENT DOCUMENTS

| | | | | |
|---|---|---|---|---|
| 4,814,735 A * | 3/1989 | Williamson | ................ | 336/192 |
| 6,207,896 B1 | 3/2001 | Toyomura | ................ | 174/58 |
| 6,493,246 B2 | 12/2002 | Suzui et al. | ................ | 363/95 |
| 6,734,775 B2 * | 5/2004 | Chung | ................ | 336/198 |
| 6,801,442 B2 | 10/2004 | Suzui et al. | ................ | 363/55 |
| 6,879,235 B2 * | 4/2005 | Ichikawa | ................ | 336/200 |
| 6,927,667 B1 * | 8/2005 | Busletta et al. | ................ | 336/208 |
| 7,091,815 B2 * | 8/2006 | Suzui | ................ | 336/200 |
| 2002/0044473 A1 | 4/2002 | Toyomura et al. | ................ | 363/142 |
| 2004/0118446 A1 | 6/2004 | Toyomura | ................ | 136/244 |
| 2004/0151011 A1 | 8/2004 | Toyomura et al. | ................ | 363/146 |
| 2004/0174240 A1 | 9/2004 | Suzui | ................ | 336/150 |
| 2004/0183642 A1 | 9/2004 | Suzui | ................ | 336/192 |
| 2004/0222874 A1 | 11/2004 | Suzui | ................ | 336/198 |
| 2004/0223281 A1 | 11/2004 | Suzui et al. | ................ | 361/118 |
| 2004/0223310 A1 | 11/2004 | Toyomura | ................ | 361/777 |
| 2004/0246087 A1 | 12/2004 | Suzui | ................ | 336/182 |

FOREIGN PATENT DOCUMENTS

| | | |
|---|---|---|
| JP | 11-307364 | 11/1999 |
| JP | 2001-143945 | 5/2001 |

* cited by examiner

*Primary Examiner*—Anh Mai
(74) *Attorney, Agent, or Firm*—Fitzpatrick, Cella, Harper & Scinto

(57) ABSTRACT

In an inductor having a core and first and second coils wound upon the core, the wire of the first coil and the wire of the second coil lie are wound so as to lie parallel to each other and contact the core. The winding starting position of the first coil is made to coincide with the winding starting position of the second coil along the axial direction of the core and is offset from the winding starting position of the second coil along the winding direction of the core. As a result, the area factor of the coils in the winding area of the inductor can be improved and the size of the inductor reduced.

4 Claims, 30 Drawing Sheets

FRONT VIEW

INDUCTOR AND TRANSFORMER

FIELD OF THE INVENTION

This invention relates to an inductor and a transformer. More particularly, the invention relates to an inductor and transformer used in a power supply circuit or the like, and to a printed circuit board on which these are mounted.

BACKGROUND OF THE INVENTION

Use of lower voltages and higher currents in switching power supplies is now a definite trend that is attendant upon a decline in voltage and increase in capacity of the internal power supplies of information devices in recent years.

FIG. 1 is a perspective view useful in describing the typical structure of an inductor used in a switching power supply, and FIG. 2 is a bottom view of the inductor of FIG. 1. By way of example, an example of the structure of such an inductor is described in the specification of Japanese Patent Application Laid-Open No. 11-307364.

An inductor 1 of the kind shown in FIG. 1 includes a columnar core 3 (this will be referred to simply as a "core 3" below) of a bobbin 2 comprising an electrical insulator. After a coil 4 is wound upon the core 3, both ends of the coil are connected to pin-shaped terminals. Furthermore, the core 3 is a hollow columnar body. As shown in the bottom view of the inductor 1 of FIG. 2, well-known E-shaped cores 6 (each referred to simply as a "core 6" below) are inserted symmetrically into two insertion openings 5 of the core 3.

Further, FIG. 3 is a schematic view illustrating a development of the surface of the core 3. The coil 4, which is formed by wire having a certain wire width, indicates an area occupied on the core surface. It should be noted that the wire width is equal to the width dimension of the wire projected onto the core surface when the wire is wound upon the core. For example, if the cross section of the wire is rectangular and the wire is wound in such a manner that one side thereof contacts the core, as illustrated in the schematic view of the core cross section shown in FIG. 4, the wire width will be equal to the width dimension of the wire. Similarly, if the cross section is circular, then the diameter will be the wire width. The wire width, therefore, is $\delta 2$ in FIG. 3. The cross-sectional shape of the core 3 is represented by a square shape for explanatory purposes.

In a conventional low-voltage, large-current inductor, wire having a large cross section is used for the coil in order to lower resistance to conduction. The conventional inductor 1 shown in FIG. 3 is such that when the wire is wound upon the core, wire having a wire width that will just fall within the length (winding-area width W) of the core along the axial direction thereof is selected appropriately to thereby assure that the cross-sectional area of the wire will be as large as possible.

It should be noted that A and B in FIG. 3 respectively illustrate a position at which the wire first makes contact with the core 3 and starts being wound upon the core 3, and a position at which winding of the wire ends and departs from the core 3. These positions will be referred to as winding starting (and end) positions. The length of one wire that occupies the core along the axial direction thereof when the wire has been wound is defined as the wire pitch (also referred to simply as "pitch"). The pitch of the wire of coil 4 in FIG. 3, therefore, is $\delta 2$. Furthermore, the direction along which the wire is wound upon the core is defined as the winding direction of the core. In FIG. 3, this indicates a direction orthogonal to the axial direction of the core.

However, even if wire having a large cross section is used, as described above, an empty space remains in the vicinity of the winding starting position or wiring end position on the core 3. FIG. 5 is an enlarged schematic view of the core 3. Here the area other than the area occupied by the coil 4 in FIG. 3 is represented by a hatched area X2. As indicated by the hatched area X2 in FIG. 5, an empty space remains near the winding starting position or wiring end position on the core 3 and the area factor (area occupation ratio) of the winding area (W) by the coil declines. The result is an inductor of greater size.

SUMMARY OF THE INVENTION

Accordingly, an object of the present invention is to raise the area factor of the coil in the winding area of an inductor, thereby reducing the size of the inductor.

Another object of the present invention is to provide a transformer the size of which is reduced by raising the area factor of the coil in the winding area.

Yet another object of the present invention is to provide a push-pull circuit that employs the above-mentioned transformer, and a printed circuit board on which the transformer is mounted.

According to the present invention, the foregoing objects are attained by providing an inductor or a transformer comprising a core and first and second coils wound upon the core, wherein a wire constituting the first coil and a wire constituting the second coil are wound so as to lie parallel to each other and such that each contacts the core, and a winding starting position of the first coil coincides with a winding starting position of the second coil along the axial direction of the core and is offset from the winding starting position of the second coil along the winding direction of the core.

If this arrangement is adopted, winding starting and end positions of the first and second coils are not arranged side by side with respect to the axial direction of the core. Accordingly, if the sum of the widths of the wires used in the two coils is made the same as the width of the coil in the prior art, the width of the winding area of the core can be reduced and the area factor can be improved to thereby reduce the size of the inductor.

The wires of the first and second coils may have a cross section that is a rectangle.

The first and second coils may have end portions that are led out along the axial direction of the core.

Alternatively, the first and second coils may have end portions that are led out along the axial direction of the core, and the core may be provided with cut-away portions at locations where the end portions are led out.

Two end portions of the first coil and two end portions of the second coil may be led out to respective ones of both sides of the core along the axial direction thereof.

In this case, end portions of the first and second coils that have been led out to the same side in relation to the axial direction of the core may be connected.

Furthermore, an inductor and transformer according to the present invention are ideal for use in a power supply circuit such as a push-pull circuit upon being mounted on a printed circuit board.

Furthermore, in accordance with a transformer according to the present invention, winding starting and end positions of the first and second coils are not arranged side by side with respect to the axial direction of the core. Accordingly, if the sum of the widths of the wires used in the two coils is made the same as the width of the coil in the prior art, the width of the winding area of the core can be reduced and the area factor can be improved. This effect is very great especially in a transformer for low-voltage, large-current applications.

If the transformer of the invention is used in a push-pull circuit, the degree of coupling between primary-side windings, namely between the first and second coils, is improved. This has the effect of suppressing surge voltage when a switching element in the push-push circuit is switched. This leads to an improvement in the reliability of the circuit that uses the transformer.

Further, by virtue of the arrangement described above, it is possible to lower the heights of the inductor and transformer of the invention. By using the inductor or transformer of the present invention, therefore, the distance between the edge portions on both sides of the printing circuit board on which the inductor or transformer is mounted is shortened. As a result, a thinner design can be adopted for the circuit board on which inductor or transformer has been mounted.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 14 is a schematic view which FIG. 5 is illustrated in a manner similar to that of FIG. 13;

DETAILED DESCRIPTION OF THE PREFERRED EMBODIMENTS

Figure 1:
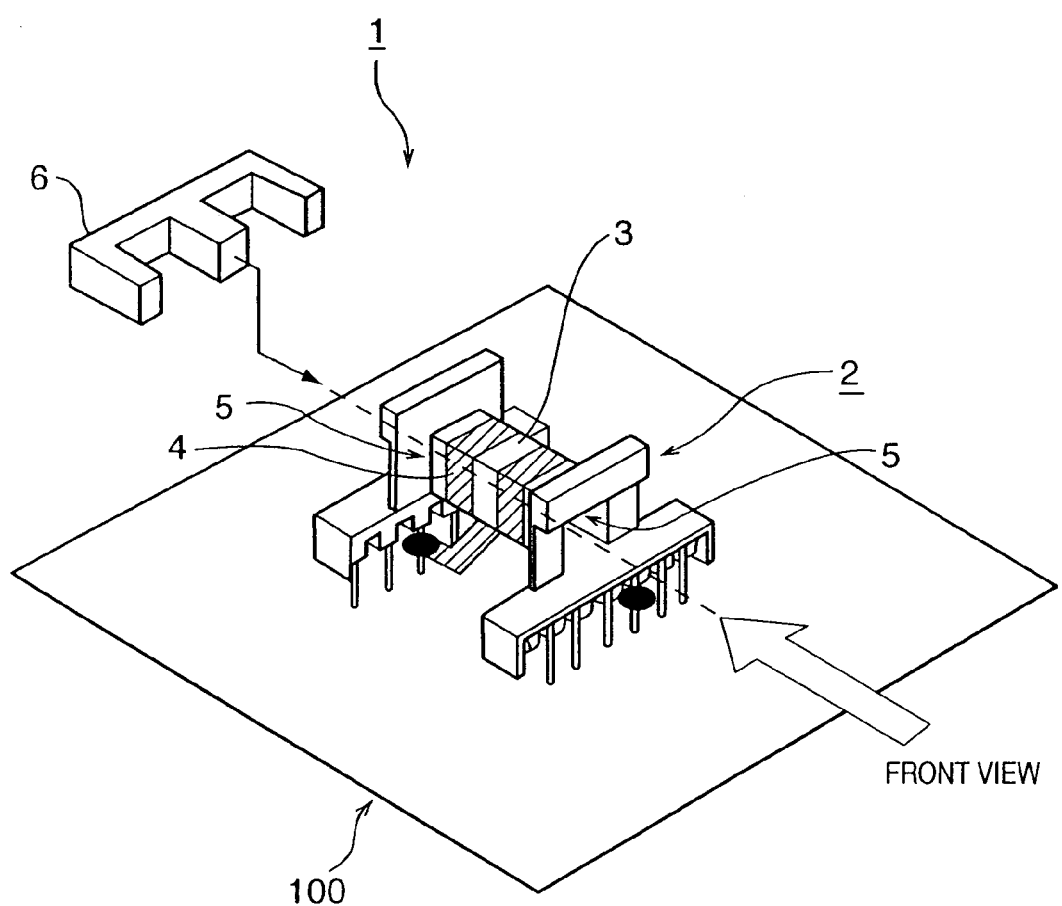
FIG. 1 is a perspective view illustrating the structure of an inductor according to the prior art.

Preferred embodiments of the present invention will now be described in detail in accordance with the accompanying drawings. Note that each element in the following embodiment is not intended to limit the scope of the invention but is described only as an example.

It should be noted that in the drawings of the embodiments described below, structural elements identical with those mentioned above are designated by like reference characters and need not be described again.

<Basic Structure>

Described first will be the basic structure of an inductor according to the present invention.

Figure 6:
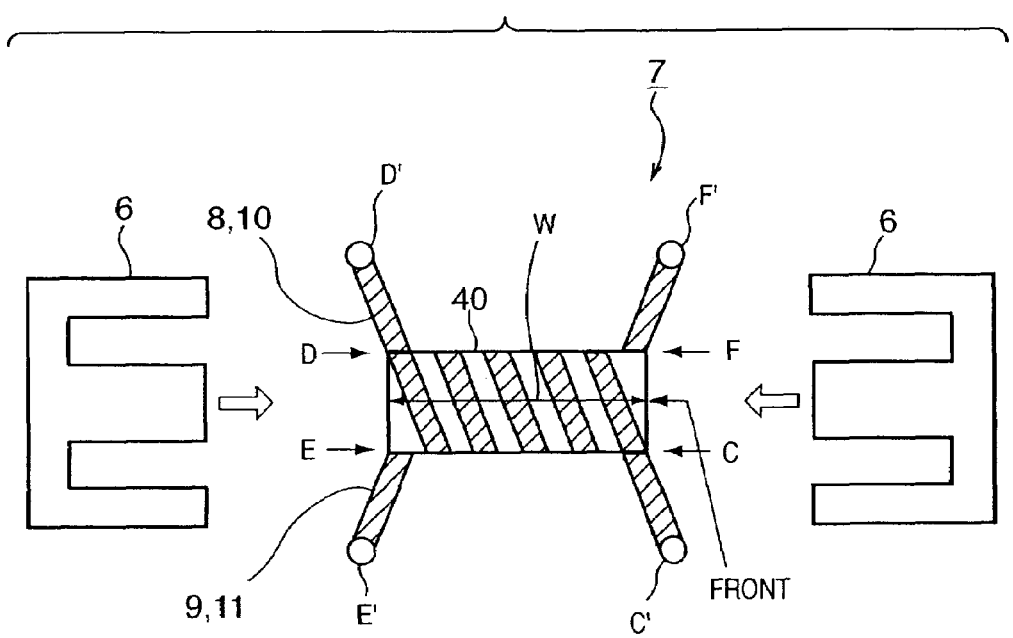
FIG. 6 is a top view illustrating the basic structure of an inductor according to the present invention.

FIG. 6 is a top view illustrating the basic structure of an inductor 7 according to the present invention. As shown in FIG. 6, the inductor 7 comprises a core 40, a first coil 8 (also referred to simply as "coil 8" below), a second coil 9 (also referred to simply as "coil 9" below) and one set of the cores 6.

The core 40, which is a hollow columnar body having a square cross section, is not equipped with pin-shaped terminals or the like. The coils 8 and 9 are composed of wires 10 and 11, respectively, which are well-known insulated copper wires. As will be described in detail below, the wires of the two coils are wound on the core so as to lie parallel to each other and contact the core.

The details of one example of winding the above-mentioned coils will now be described with reference to the drawings.

Figure 7:
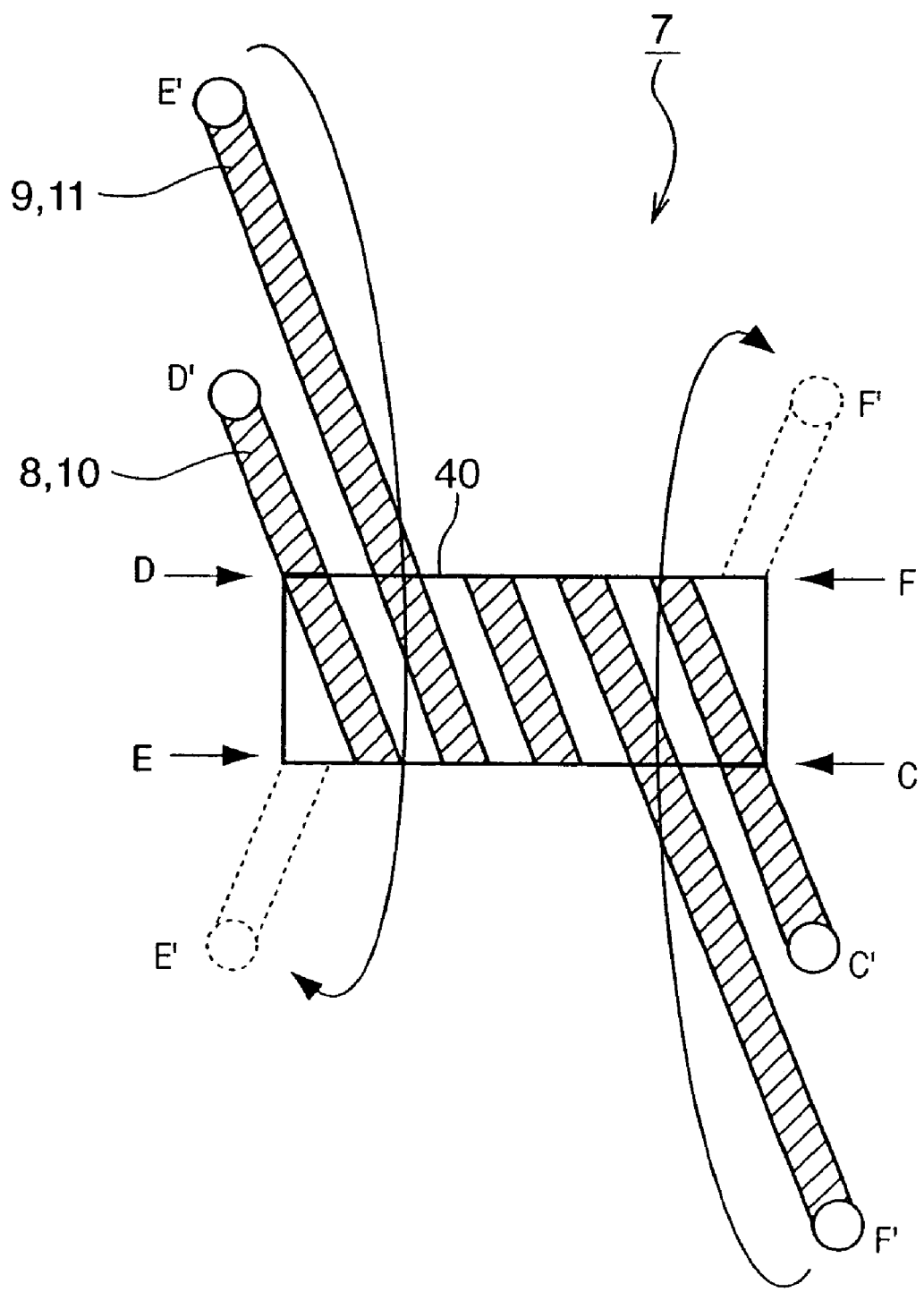
FIG. 7 is a diagram for describing a method of winding the inductor shown in FIG. 6.
Figure 8:
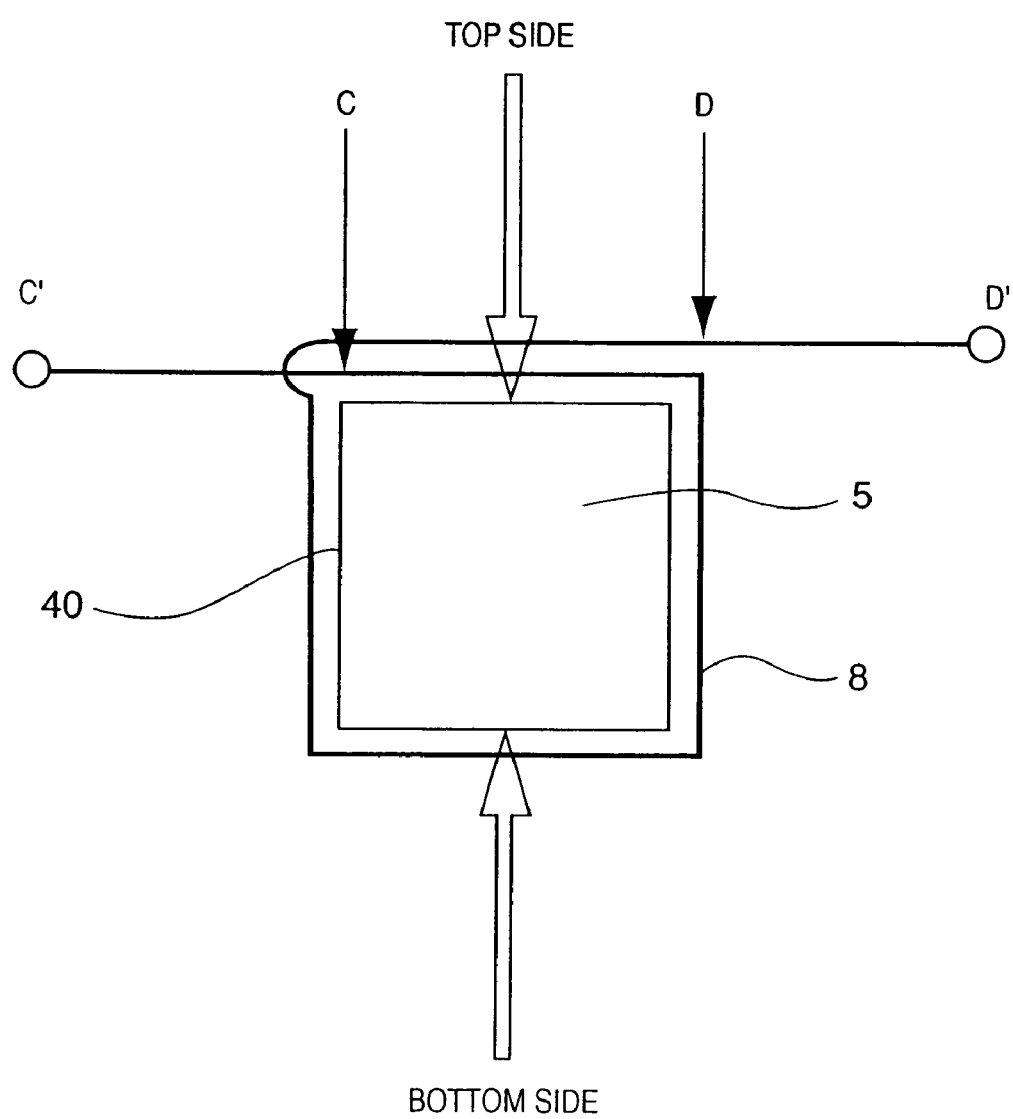
FIG. 8 is a side view of an inductor on which a coil has been wound.
Figure 9:
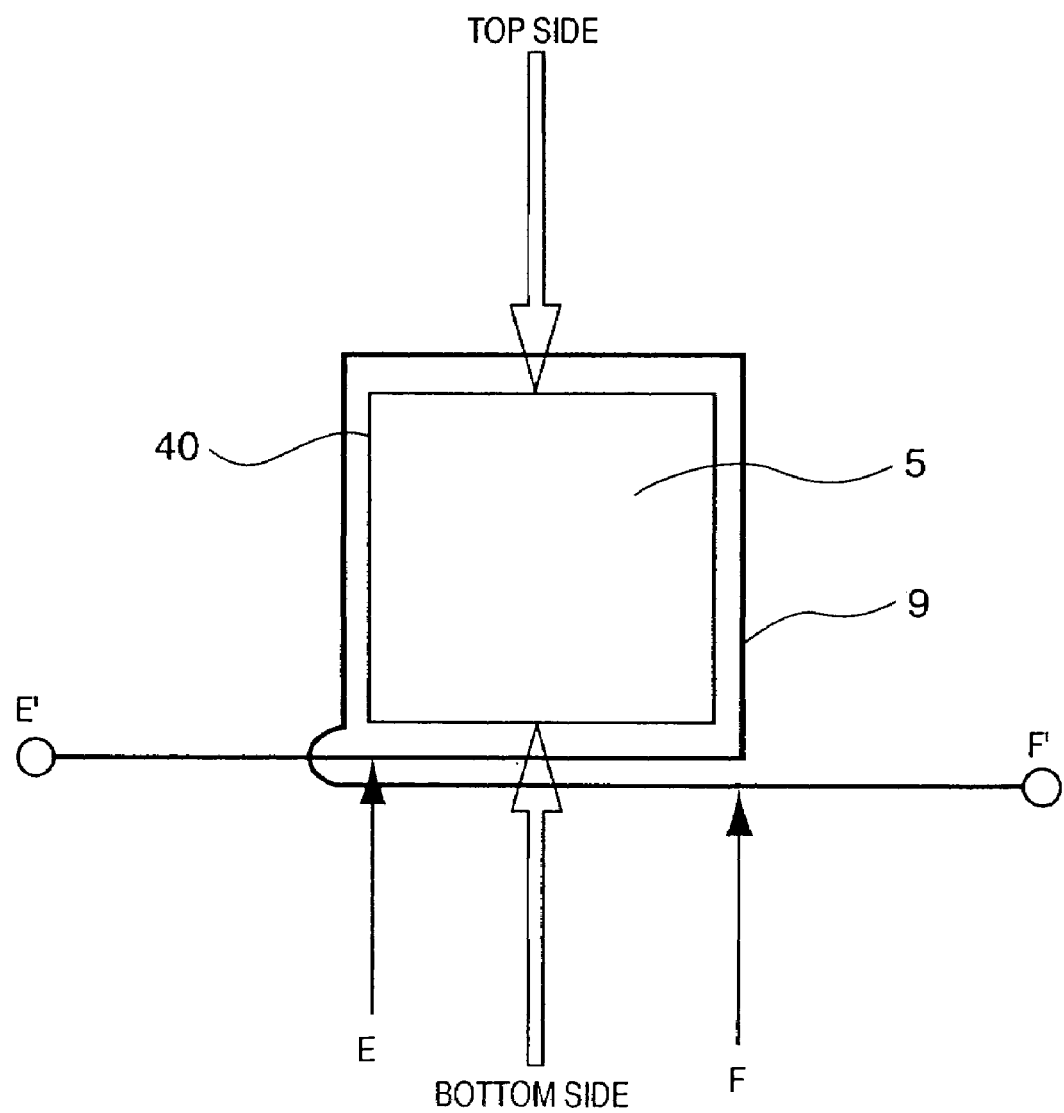
FIG. 9 is a side view of an inductor on which a coil has been wound.

FIG. 7 is a top view of an inductor 7 useful in describing a method of winding the coils 8 and 9. Further, FIGS. 8 and 9 are side views of the inductor 7 useful in describing the disposition of the ends of the coils 8 and 9, respectively. In the side views of FIGS. 8 and 9, the upper side of the core 40 is defined as the top side and the side that is directly opposite is defined as the bottom side for the sake of description. The cores 6 are not shown in FIGS. 7, 8 and 9.

First, a winding starting position C of a wire 10 is situated at the lower right end of the core 40. A wire 11 is placed on the core 40 so as to lie parallel to the wire 10. Next, the wires 10 and 11 are wound on the core 40 simultaneously in such a manner that two turns of the wire 10 are laid. As a result, one turn of the wire 11 is wound on the core, as illustrated in FIG. 7. If both ends E' and F' of the wire 11 are subsequently wound by one-half turn, both ends of the wire 11 will be placed at the positions of E', F', respectively, represented by the dashed lines, thereby completing the coil winding process.

Accordingly, as illustrated in FIGS. 6, 8 and 9, the inductor 7 is such that both ends C' and D' of the coil 8 are placed on the top side of the core 40, and both ends E' and F' of the coil 9 are placed on the bottom side of the core.

In FIGS. 6 and 7, a spacing is provided between the windings, although this is to express individually the methods of winding the two coils. In order to raise the area factor, it is desirable to select a wire width that will just fall within the winding-area width W (i.e., a width that will not give rise to a gap between the windings). Further, if the wire width is thus selected, the winding starting position (end position) will come to be disposed at each corner of the core of its own accord merely by the above-described winding process, and the wires will come to be placed on the core uniformly.

Several embodiments of inductors and transformers according to the present invention having the basic structure set forth above will now be described.

First Embodiment

An inductor 12 according to a first embodiment of the present invention will be described mainly with reference to FIGS. 10 to 14.

The inductor 12 of this embodiment has been wound by a method similar to that of the inductor 7 described with reference to FIGS. 6 to 9 above, and the method need not be described again.

Figure 10:
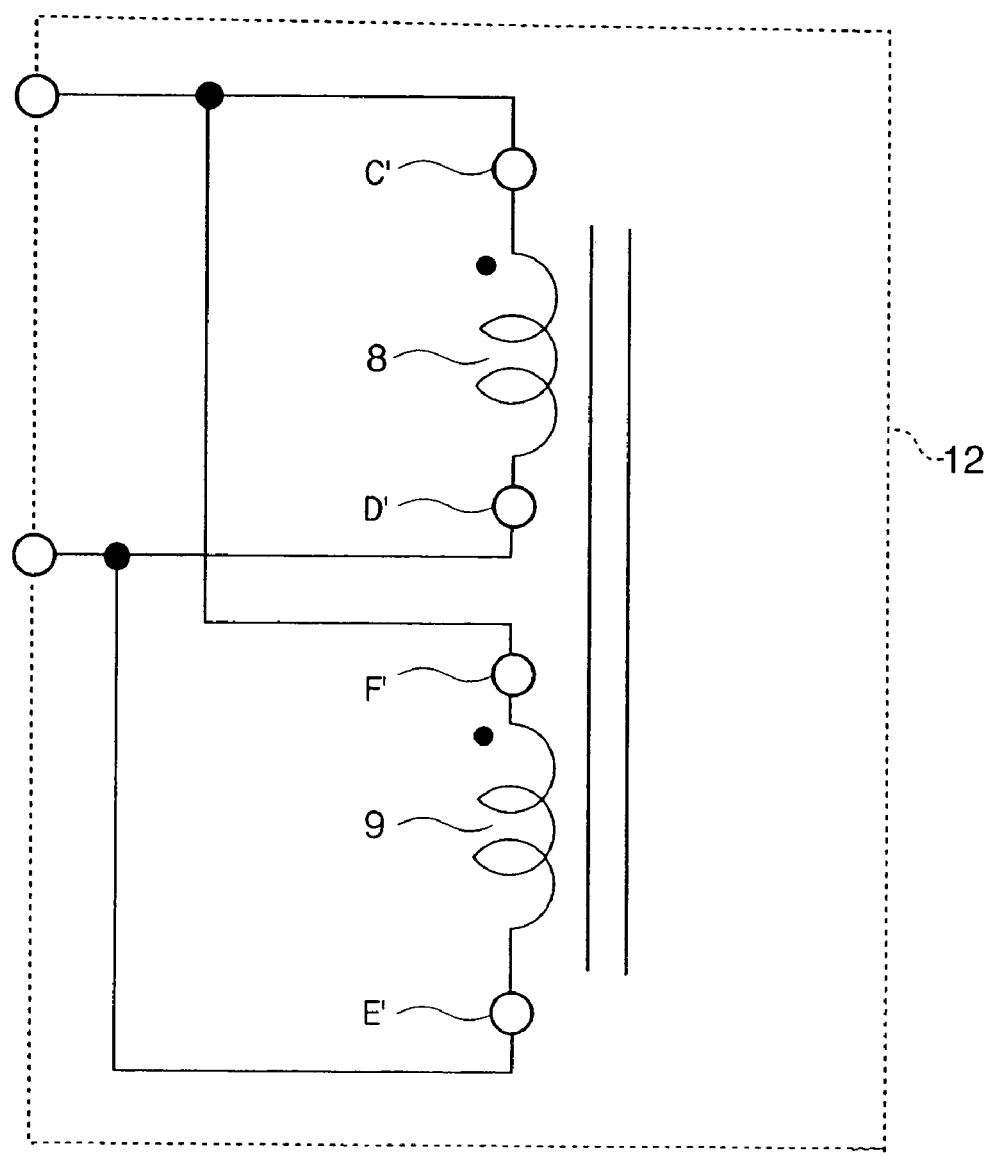
FIG. 10 is a circuit diagram illustrating the connections of coils of an inductor according to a first embodiment of the present invention.

FIG. 10 is a circuit diagram illustrating the connection relationship of coils of the inductor 12. Identical-polarity coil ends C' and F' are connected, and so are identical-polarity coil ends D' and E', in such a manner that the coils 8 and 9 are rendered magnetically parallel.

Figure 11:
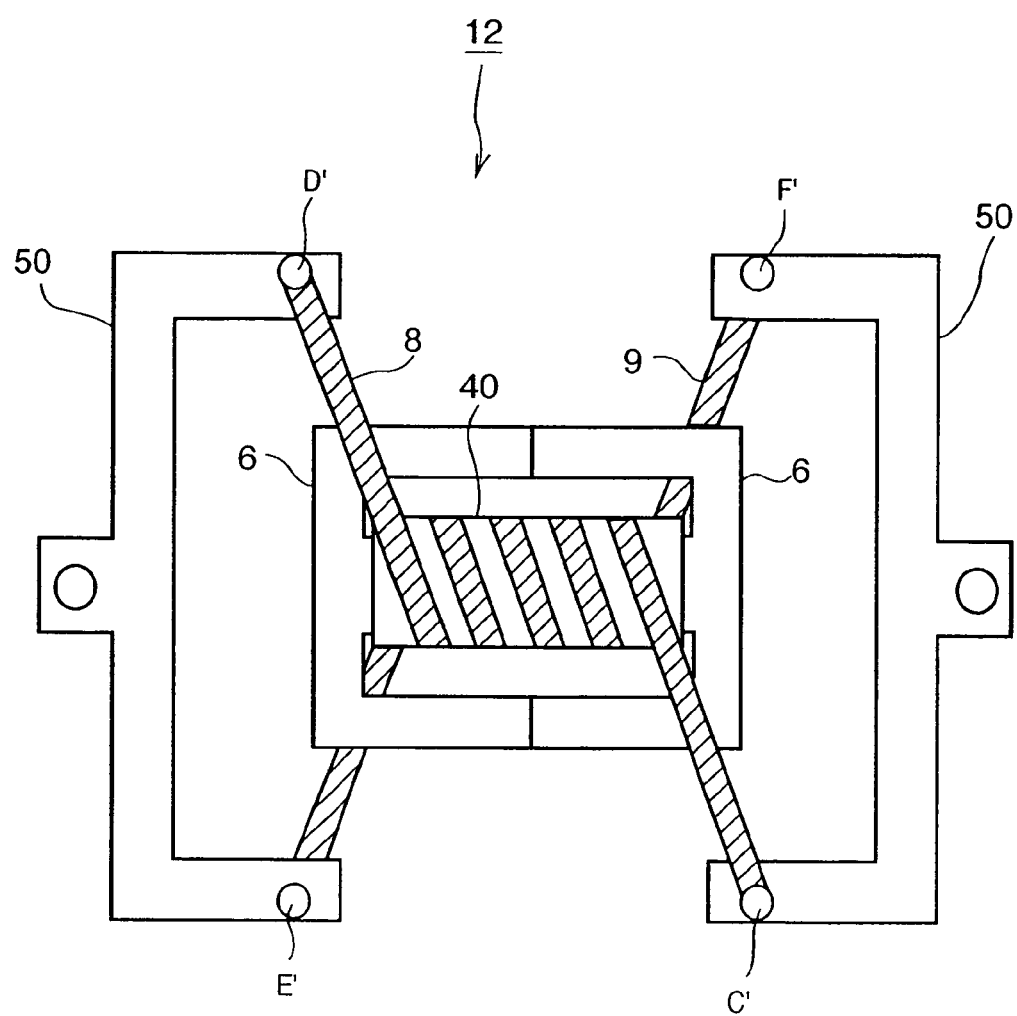
FIG. 11 is a top view of the inductor shown in FIG. 10.

FIG. 11 is a top view of the inductor 12. Here the ends of the coils are electrically connected in accordance with the circuit diagram of FIG. 10. Specifically, end D' of coil 8 and end E' of coil 9 are connected by a bus bar 50, and end C' of coil 8 and end F' of coil 9 are connected by another bus bar 50.

The inductor 12 comprises the core 40, the coils 8 and 9, the cores 6 and the bus bars 50. It should be noted that although there are a pair of cores and a pair of bus bars, the cores and bus bars will be referred to collectively as the core 6 and the bus bar 50, respectively.

Figure 12:
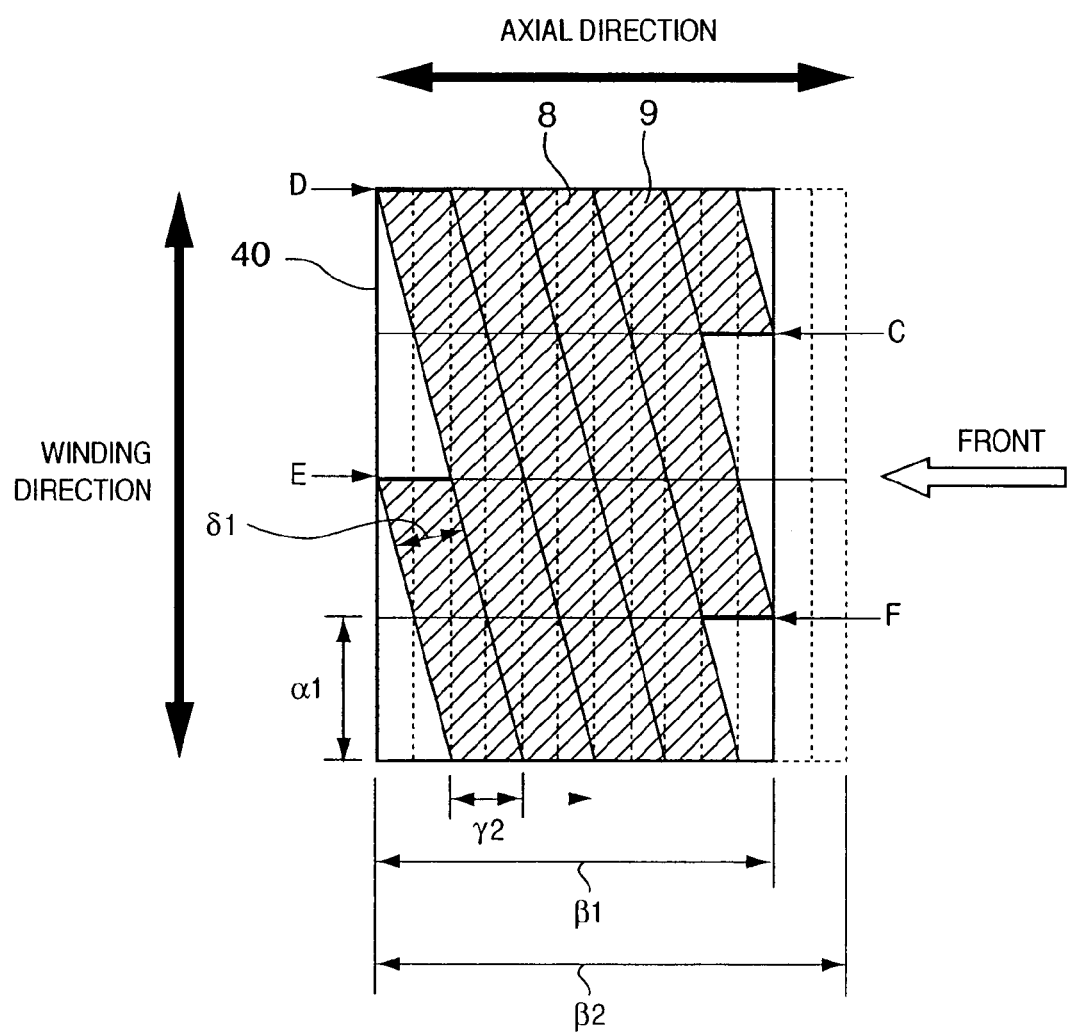
FIG. 12 is a schematic view illustrating a development of the surface of a core in the inductor shown in FIG. 10.
Figure 13:
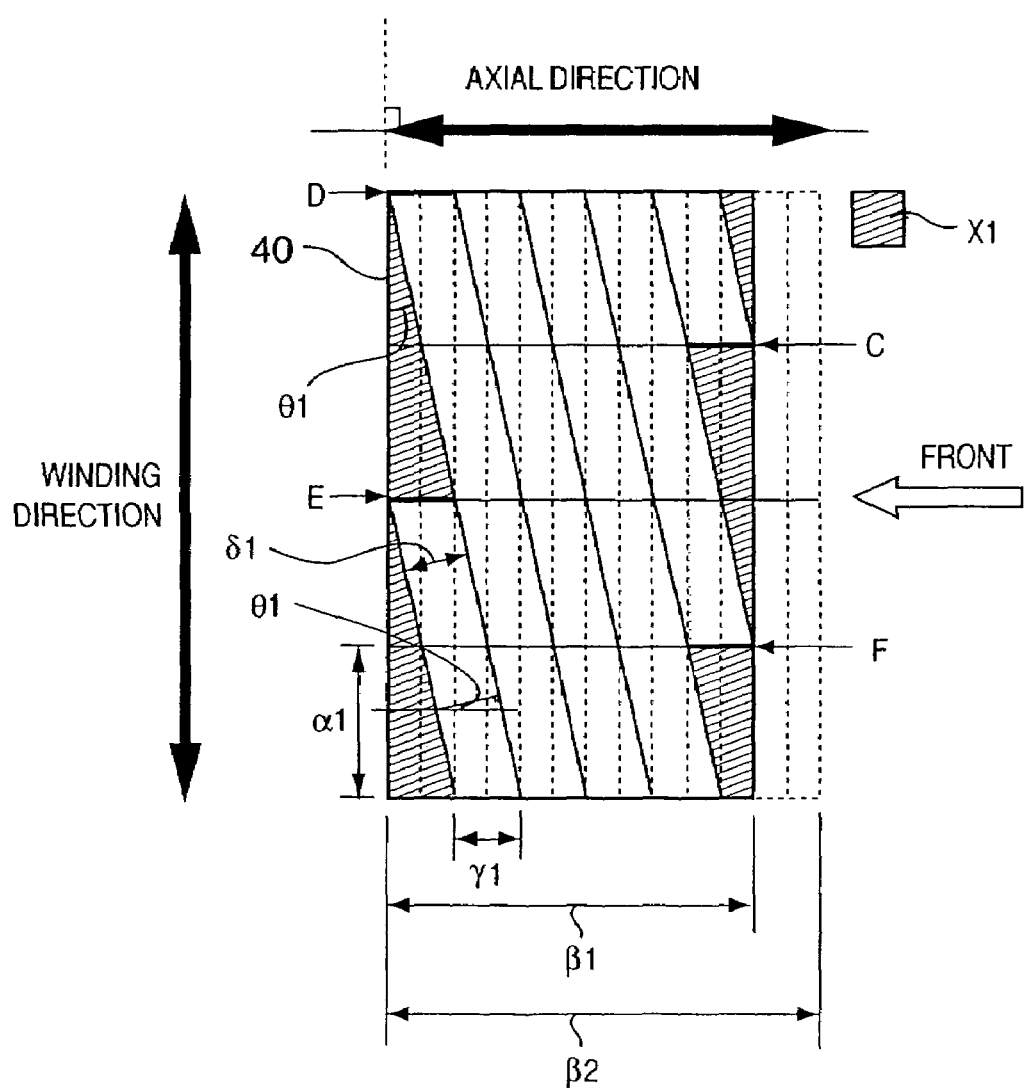
FIG. 13 is a schematic view in which an area not occupied by the coil of the core in the inductor shown in FIG. 10 is illustrated in a manner the same as that shown in FIG. 12.

FIG. 12 is a schematic view illustrating the core 40, in which the area that the coils 8 and 9 that occupy on the surface of the core 40 is shown in a state in which the surface of the core 40 has been developed. FIG. 13 is a schematic view in which an area other than an area occupied by the coils in FIG. 12 is represented by a hatched area X1.

As shown in FIG. 12, the core 40 is a hollow columnar body have a square cross section one side of which is $\alpha 1$. The length (winding-area width) of the core 40 along the axial direction is $\beta 1$. The coils 8 and 9 are composed of well-known flat copper wire coated with an insulator. The wire width of both coils is $\delta 1$, which will just fit into the winding-area width.

Figure 3:
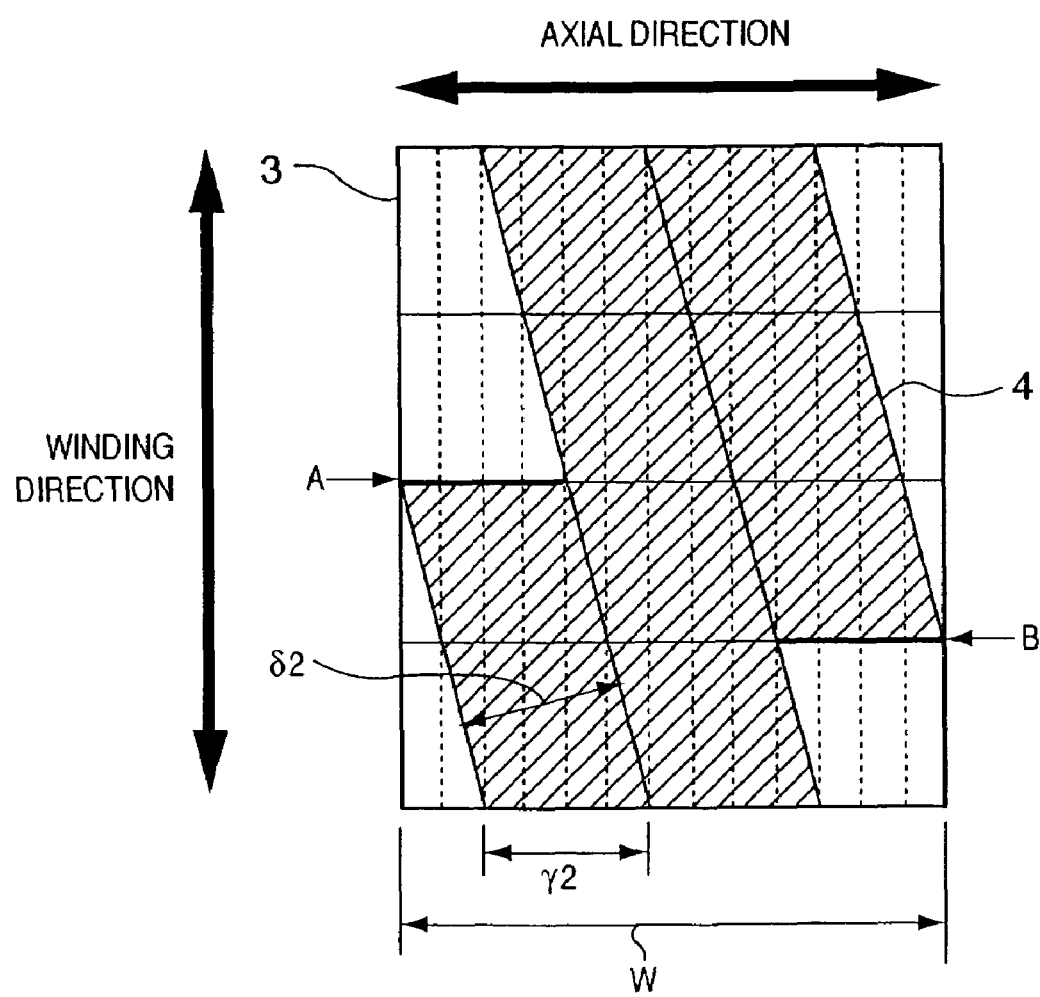
FIG. 3 is a schematic view illustrating a development of the surface of a core in the inductor shown in FIG. 1.
Figure 4:
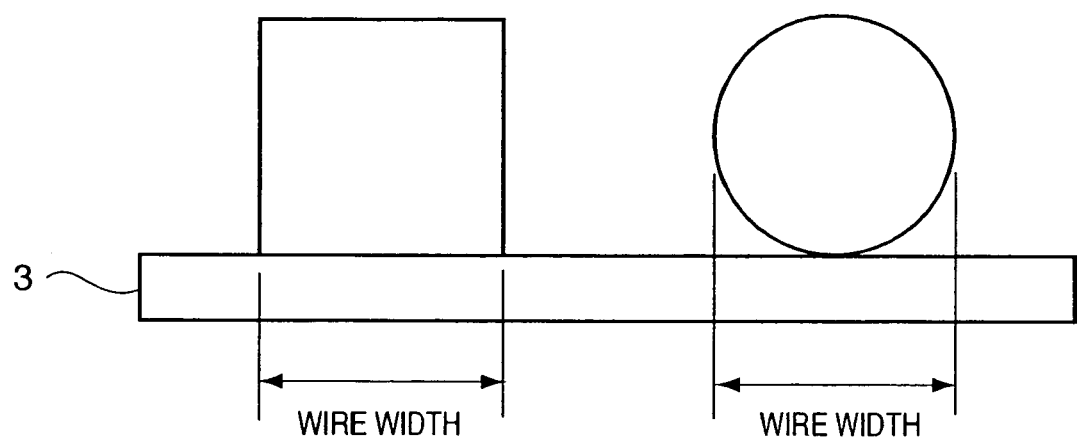
FIG. 4 is a schematic view illustrating a development of the surface of a core useful in describing wire width.
Figure 5:
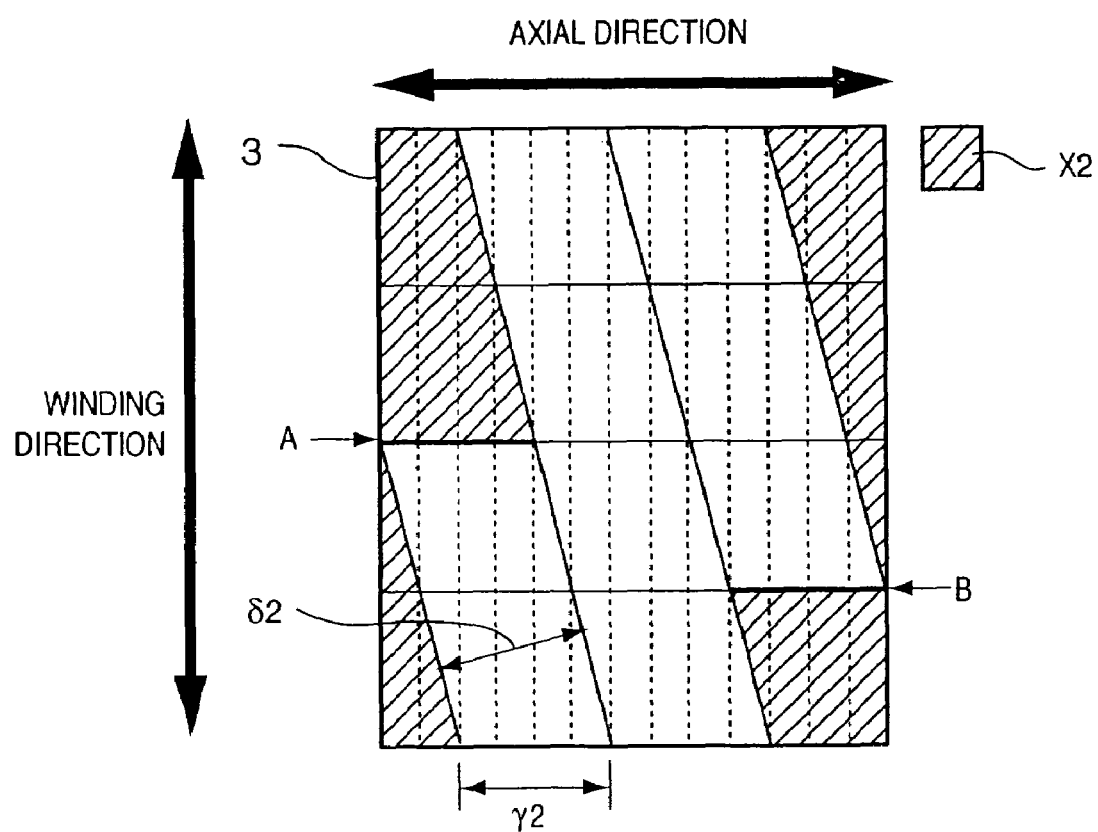
FIG. 5 is a schematic view in which an area not occupied by the coil of the core in the inductor shown in FIG. 1 is illustrated in a manner the same as that shown in FIG. 3.

The effects of this embodiment will now be described in comparison with the prior-art arrangement illustrated in FIG. 3. Let $\theta 1$ and $\theta 2$ represent the angles that the winding of coil 8 forms with the axial and winding directions, respectively, on the core, as illustrated in FIG. 13.

First, with regard to the inductor according to this embodiment, the area SX1 of the hatched area X1 other than the area occupied by the coil shown in FIG. 13 can be expressed by the following equation:

$$SX1 = [(\gamma 1) \times (2\alpha 1) \times (1/2) \times 4 \qquad (1)$$
$$= 4(\gamma 1 \times \alpha 1)$$

where the following holds:

$$(\gamma 1) \times \cos \theta 1 = \delta 1 \qquad (1\text{-}1)$$

$$\therefore \gamma 1 = \delta 1 / \cos \theta 1 \qquad (1\text{-}2)$$

Figure 14:
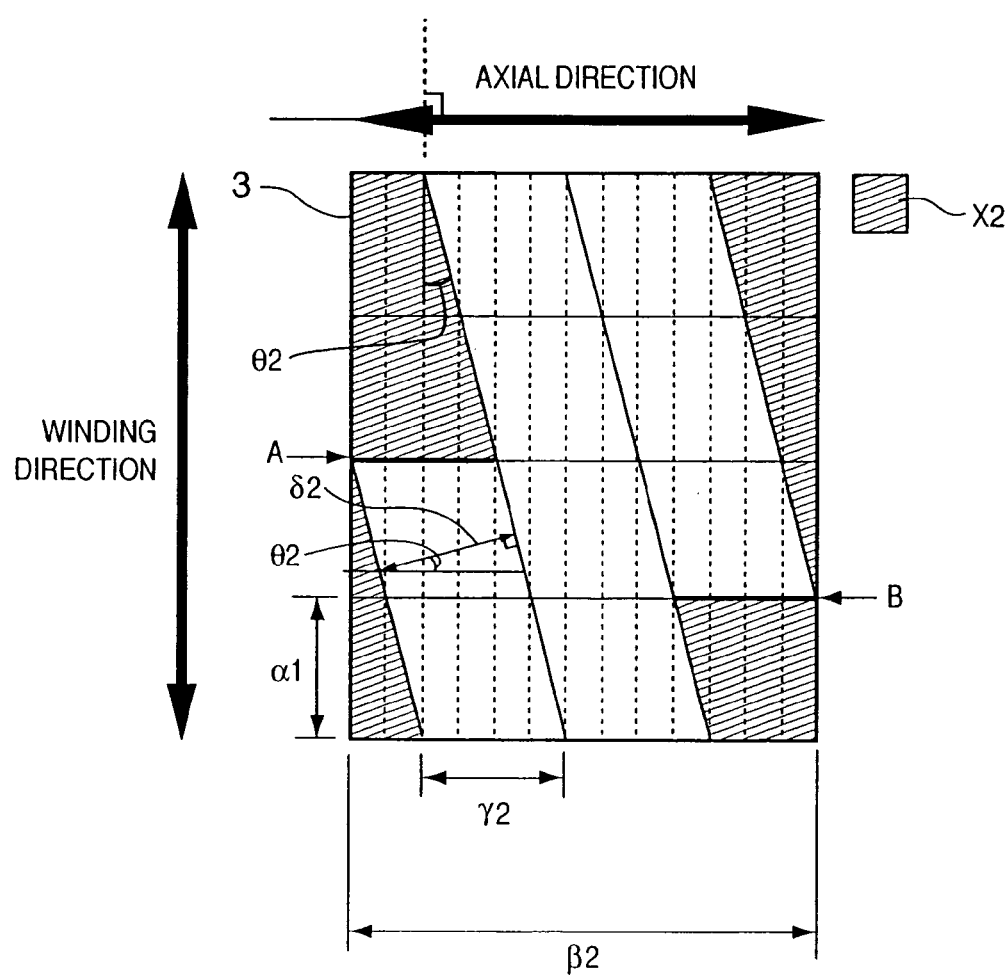

Next, as an example for comparison purposes, the area of the area other than the area occupied by the coil in the inductor 1 of the prior-art example is found. FIG. 14 is a schematic view of the core 3 in which an area other than an area occupied by the coil 4 in FIG. 3 is represented by a hatched area X2 in a manner similar to that of FIG. 13. Here the wire width $\delta 2$ of inductor 1 is the same as the total of the wire widths of coil 8 and coil 9 above, and it is assumed that this is twice $\delta 1$. Further, it is assumed that the wire thickness of coils 8 and 9 in FIG. 13 and the wire thickness of coil 4 in FIG. 14 are the same. That is, the total of the cross-sectional areas of the two coils 8 and 9 in FIG. 13 is equal to the cross-sectional area of coil 4 in FIG. 14.

In accordance with FIG. 14, the area SX2 of the hatched area X2 can be expressed by the following equation:

$$SX2 = [(\gamma 2) \times (4\alpha 1) \times (1/2) \times 2 \qquad (2)$$
$$= 4(\gamma 2 \times \alpha 1)$$

$$(\gamma 2) \times \cos \theta 2 = \delta 2 \qquad (2\text{-}1)$$

$$\therefore \gamma 2 = \delta 2 / \cos \theta 2 \qquad (2\text{-}2)$$

As shown in FIGS. 12 and 13, the winding starting position D of coil 8 coincides with the winding starting position E of coil 9 along the axial direction of the core but is offset with respect to position E along the winding direction of the core. Accordingly, the winding direction of coils 8 and 9 and the winding direction of coil 4 are the same with respect to the coil. The angle $\theta 1$, therefore, is equal to the angle $\theta 2$.

Accordingly, $\cos \theta 1 = \cos \theta 2$ and we may write $$\therefore \gamma 2 = (\delta 2 / \delta 1) \times \gamma 1 \qquad (3)$$

Since $\delta 2 = (\delta 1) \times 2$, as mentioned above, we can write the following:

$$\gamma 2 = (\gamma 1) \times 2 \qquad (4)$$

If we substitute Equation (3) into Equation (2), we have $$SX2 = 4(\gamma 2 \times \alpha 1) = 8(\gamma 1 \times \alpha 1) \qquad (5)$$

Accordingly, it will be understood from Equations (1) and (5) that SX1 is one-half of SX2.

As demonstrated by the description above, the area not occupied by the windings on the core of the inductor 12 of this embodiment (namely the unoccupied area) is reduced to one-half of the unoccupied area of the conventional inductor 1 illustrated as the example for comparison purposes. That is, the inductor of this embodiment makes it possible to greatly improve the area factor even in a case where the sum of the widths of the wires used in the two coils is equal to the width of the wire used in the conventional single coil.

Thus, the inductor according to this embodiment is characterized by having a core and first and second coils that have been wound on the core, the wire of the first coil and the wire of the second coil being wound so as to lie parallel to each other and such that each contacts the core, the winding starting position of the first coil coinciding with the winding starting position of the second coil along the axial direction of the core and being offset from the winding starting position of the second coil along the winding direction of the core.

Accordingly, as will be understood from FIGS. 12 and 13, the winding starting position C of the first coil (coil 8) coincides with the winding starting position F of the second coil (coil 9) along the axial direction of the core and is offset from the winding starting position F of the second coil along the winding direction of the core. Similarly, the winding end position D of the first coil coincides with the winding end position E of the second coil along the axial direction of the core and is offset from the winding starting position E of the second coil along the winding direction of the core.

By virtue of the structure described above, the winding starting positions C and F of the first and second coils, respectively, and the winding end positions D and E of the first and second coils, respectively, are disposed side by side along the winding direction of the core. As a result, in comparison with the conventional inductor that employs one coil having a wire width equal to the sum of the wire widths of the first and second coils, the length of the winding area W of the core can be reduced greatly and the area factor can be improved.

Thus, in accordance with this embodiment, the area on the core that is not occupied by windings (i.e., the unoccupied area) can be made very small even if the sum of the widths of the wires used in the two coils is the same as the width of the wire used in one coil in the prior art. As a result, the area factor of the inductor can be improved greatly and the inductor can be reduced in size. In particular, if the invention is applied to an inductor for low-voltage, large-current applications, the effects thereof are very great.

In addition, each of the first coil (coil 8) and the second coil (coil 9) may be divided into two (or more) coils arranged in parallel, with offsetting start positions and end positions of respective two coils along the winding direction. By this arrangement, unoccupied area of the coil in the inductor 1 (hatched area) can be reduced effectively as the first embodiment, even if the total width of the windings does not change in both of the divided coils and single coil.

It should be noted that if a copper wire having a flat (rectangular) cross section is used as the coils 8 and 9 of the inductor 12 of this embodiment, then this is desirable in that the area factor is increased in comparison with a copper wire having a round cross section.

Second Embodiment

A transformer 13 according to a second embodiment of the present invention will be described with reference to FIGS. 15 to 19.

The transformer 13 of this embodiment uses the coils 8 and 9 of an inductor, which has a structure similar to that of the inductor 12 of the first embodiment described above, as primary coils and is newly provided with a secondary coil 14.

Figure 15:
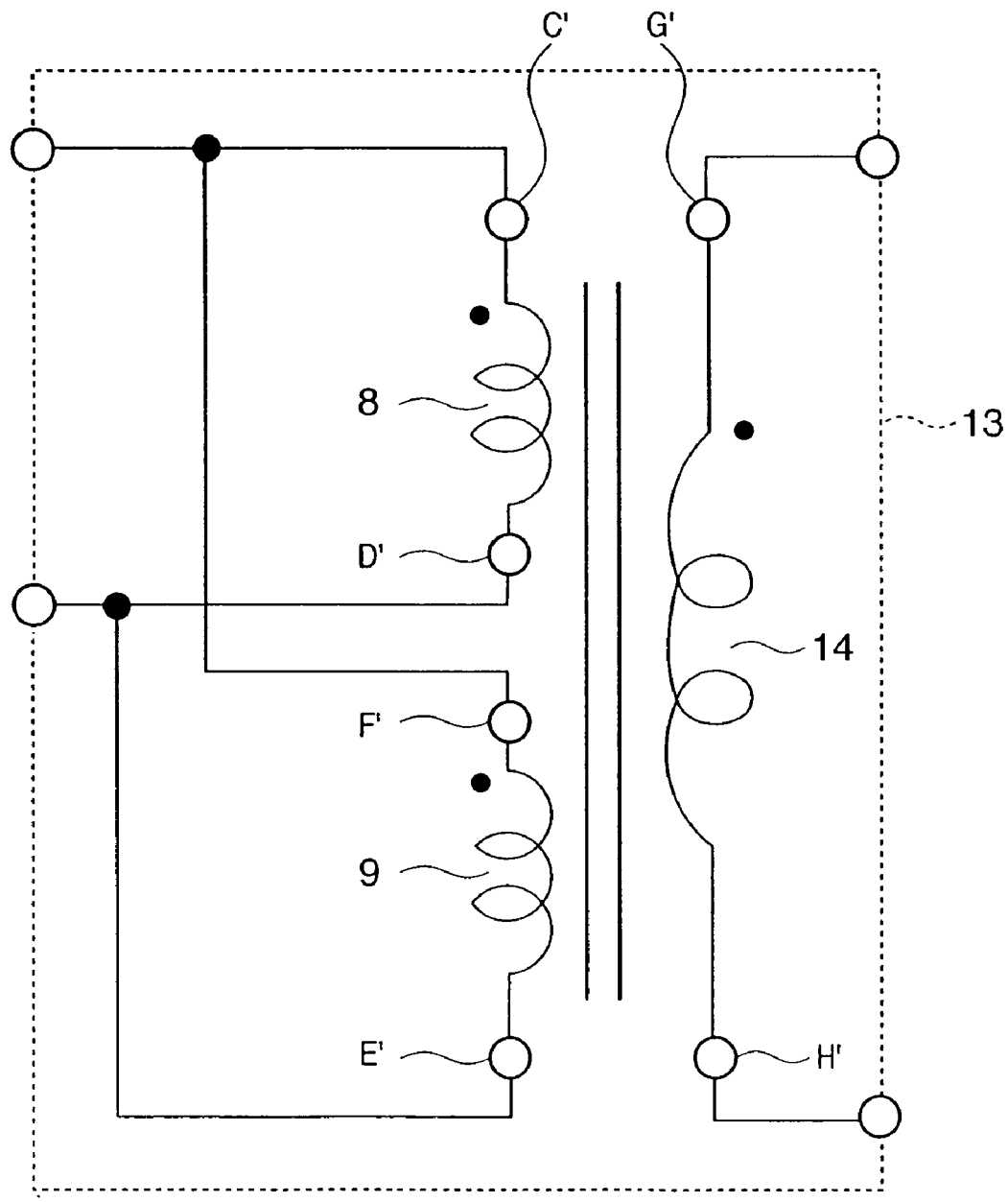
FIG. 15 is a circuit diagram illustrating the connections of coils of a transformer according to a second embodiment of the present invention.

FIG. 15 is a circuit diagram illustrating the connections of the coils of the transformer 13. The structure of the secondary coil and the method of winding thereof will be described in detail below.

Figure 16:
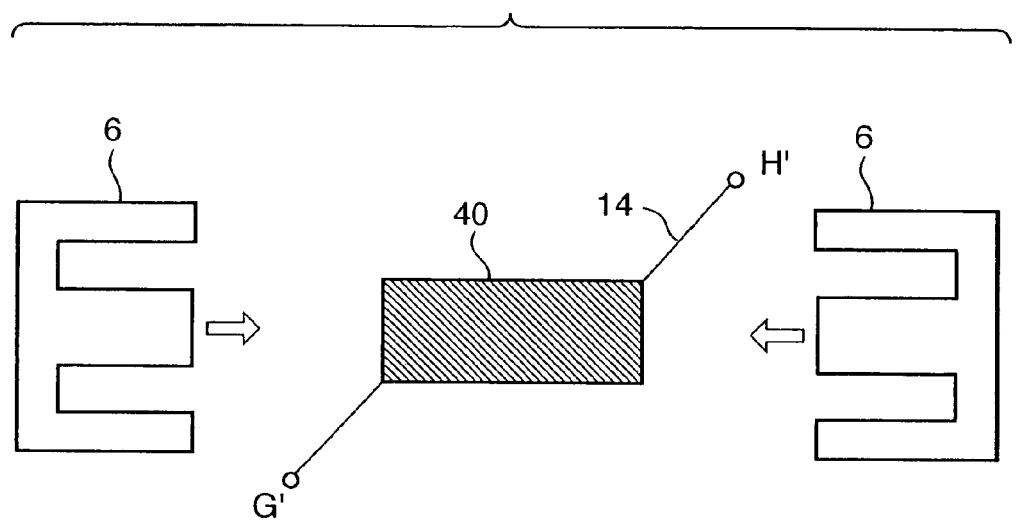
FIG. 16 is a diagram illustrating a secondary coil of the transformer shown in FIG. 15.

FIG. 16 is a top view of the core 40 on which the coil 14 serving as the secondary coil has been wound. The coil 14 is obtained by winding a wire on the core 40 20 times, and both ends of the coil 14 are led out suitably along the axial direction of the core 40. After the coil 14 is wound, the pair of cores 6 are inserted into the insertion openings on both sides of the core 40 in a manner similar to that of the inductor of the first embodiment.

Figure 17:
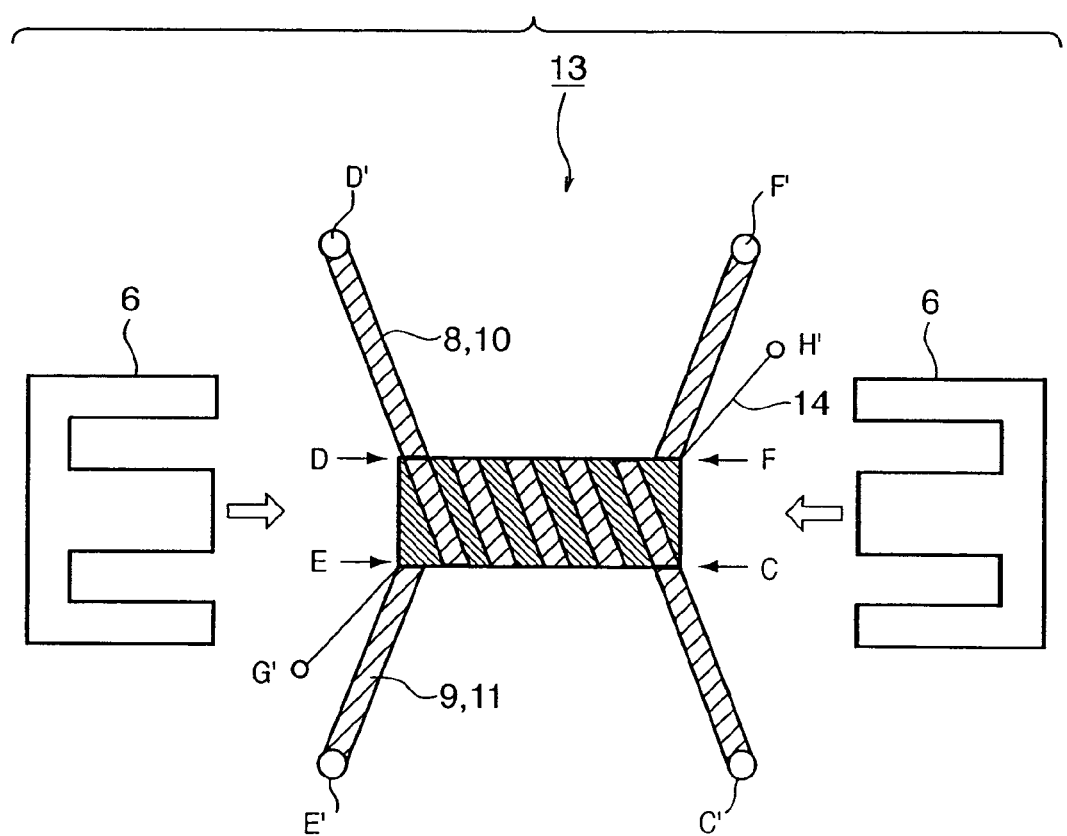
FIG. 17 is a top view of the transformer shown in FIG. 15.
Figure 18:
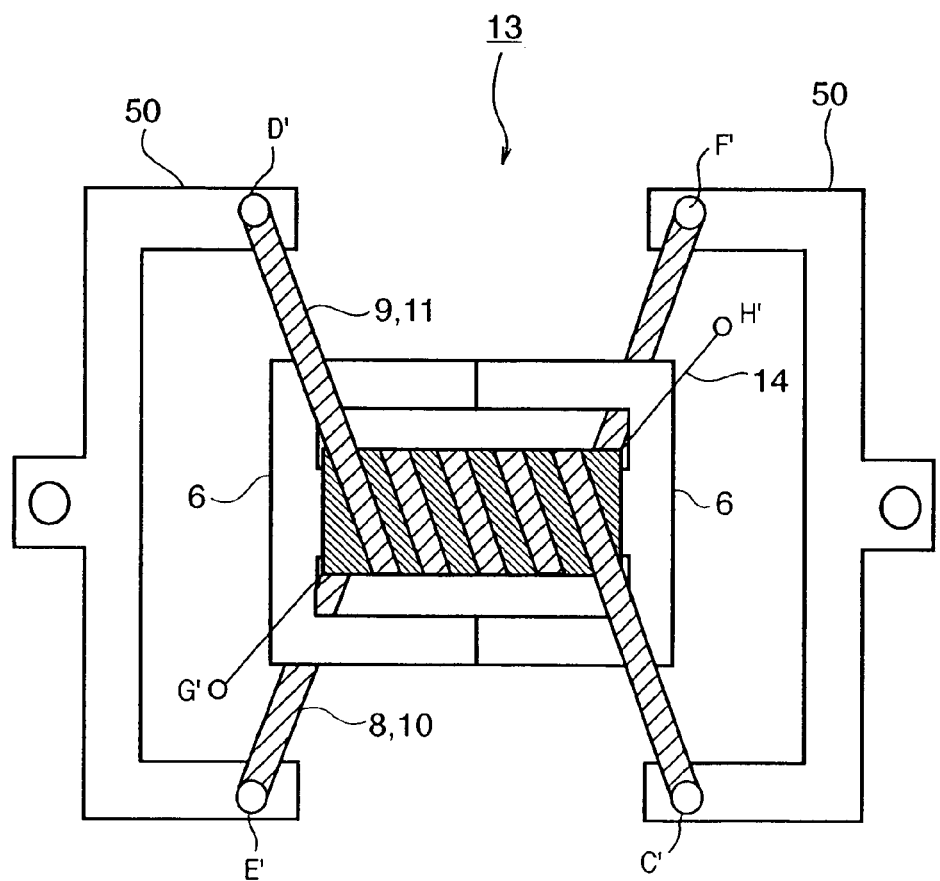
FIG. 18 is a top view illustrating the transformer of FIG. 17 in the assembled state.
Figure 19:
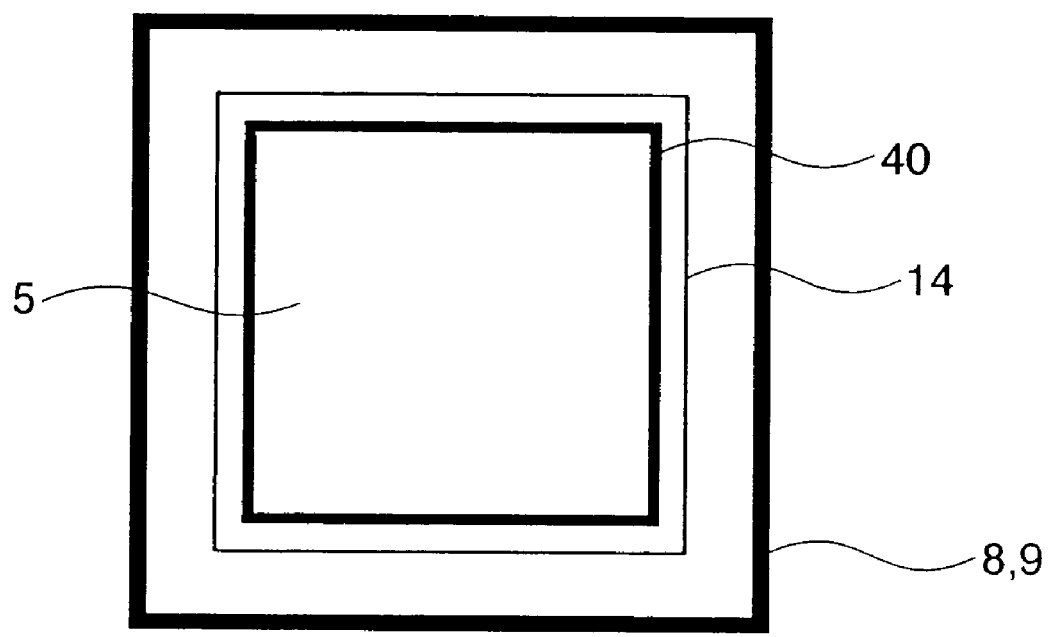
FIG. 19 is a sectional view in which coils in the transformer of the second embodiment are illustrated in a stacked state.

FIG. 17 is a top view of the transformer 13. FIG. 18 is a top view of the transformer 13 in the completed state and illustrates the ends of the coils in a state connected in accordance with the circuit diagram of FIG. 15. Specifically, end D' of coil 8 and end E' of coil 9 are connected by the bus bar 50, and end C' of coil 8 and end F' of coil 9 are connected by the other bus bar 50. FIG. 19 is a sectional view of transformer 13 and illustrates the placement of each of the coils. As shown in FIG. 19, first the coil 14 (the secondary coil) is wound upon the core 40, and then the coils 8 and 9 (both of which are the primary coils) are wound on the coil 14 to form a laminate on the core 40. It should be noted that the cores 6 are not shown in FIG. 19.

Thus, in accordance with the second embodiment, a transformer is constructed utilizing the inductor according to the present invention. As a result, transformer can be made small in size.

Third Embodiment

A transformer 15 according to a third embodiment of the present invention will be described with reference to FIGS. 20 to 26.

In comparison with the transformer 13 of the second embodiment, the transformer 15 according to this embodiment uses the same method of winding the primary coils on the core. However, in order for the transformer 15 to be used in a push-pull circuit, the conducting directions of the ends of the primary coils, the method of connecting these portions, the order in which the primary and secondary coils are wound and the method of implementing mounting on a printed circuit board differ from those of the second embodiment. These differences will now be described.

Figure 20:
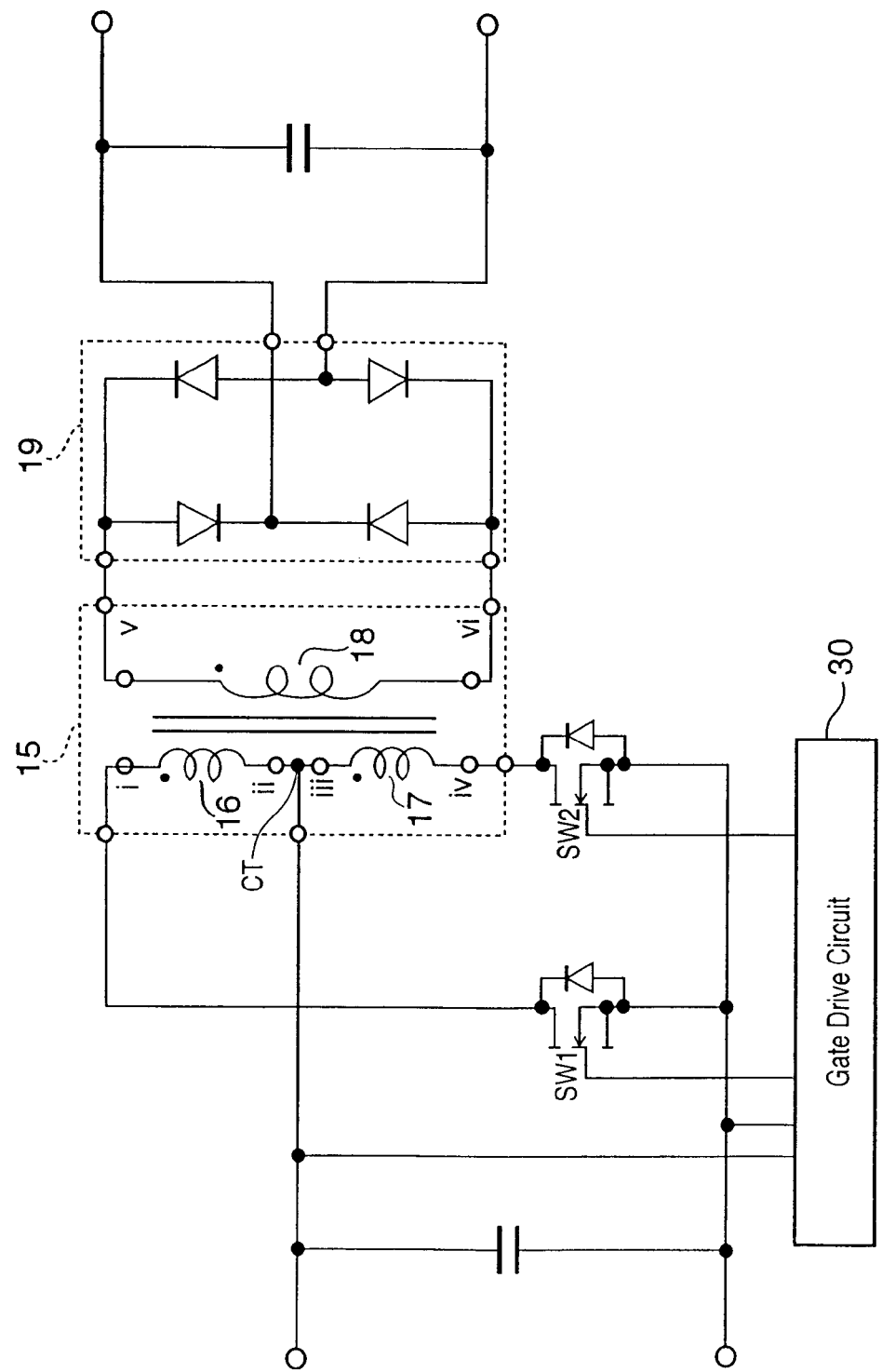
FIG. 20 is a circuit diagram of a push-push circuit using a transformer according to a third embodiment of the present invention.

FIG. 20 is a circuit diagram illustrating an example of a push-push circuit that employs a transformer according to this embodiment.

As illustrated in FIG. 20, the transformer 15 includes a set of two coils in which primary coils are serially connected, namely a first coil 16 and a second coil 17 (referred to simply as "coil 16" and "coil 17", respectively, below). The node at which these coils are serially connected is extracted as a center tap (CT) of the primary coils. It should be noted that the coils of this set are serially connected in such a manner that the polarities of the terminals on the side of the center tap are opposite (the ends of the coils in FIG. 20 are all referred to as terminals).

More specifically, the coil 16 has a terminal (1) connected to a drain terminal of a first switching element SW1 such as a MOSFET, and a terminal (2) constituting the center tap CT. The coil 17 has a terminal (4) connected to a drain terminal of a second switching element SW2 such as a MOSFET, and a terminal (3) constituting the center tap CT and having the same polarity as that of the terminal (1). Accordingly, the terminals (2) and (3) are connected and extracted as the center tap CT. The center tap is connected to the plus terminal of a CD power supply of a push-pull circuit, and the source terminals of the switching elements SW1 and SW2 are connected to the minus terminal of the DC power supply.

The output of a coil 18 serving as the secondary coil of the transformer 15 is full-wave rectified via a diode bridge 19 and delivered to the output terminals of the push-pull circuit. It should be noted that capacitors are connected across the input and output terminals of the illustrated push-pull circuit and are for suppressing fluctuation of the DC voltage. Further provided is a gate drive circuit 30 for driving the gates of the MOSFETs used as the switching elements SW1 and SW2. However, it is also permissible to use other switching elements employed in a push-pull circuit.

Figure 2:
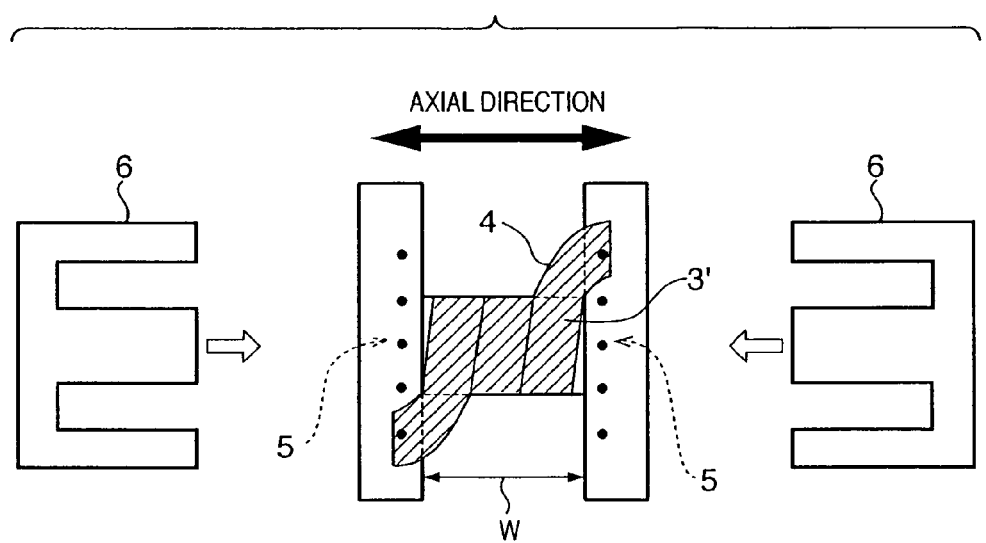
FIG. 2 is a bottom view of the inductor shown in FIG. 1.

The terminals (1), (2), (3), (4), (5) and (6) of the transformer 15 according to this embodiment correspond to the ends C', D', F', E', G', H' of the transformer 13 of FIG. 2 in terms of circuitry.

Next, a method of winding the coils of the transformer 15 of this embodiment will be described in detail.

Figure 22:
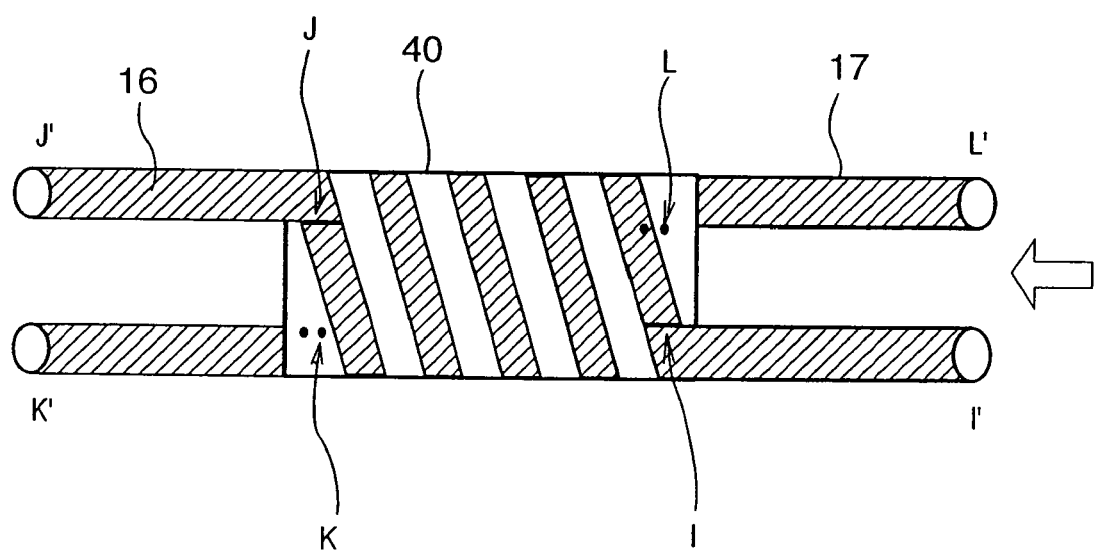
FIG. 22 is a top view of the core in the transformer shown in FIG. 10.
Figure 23:
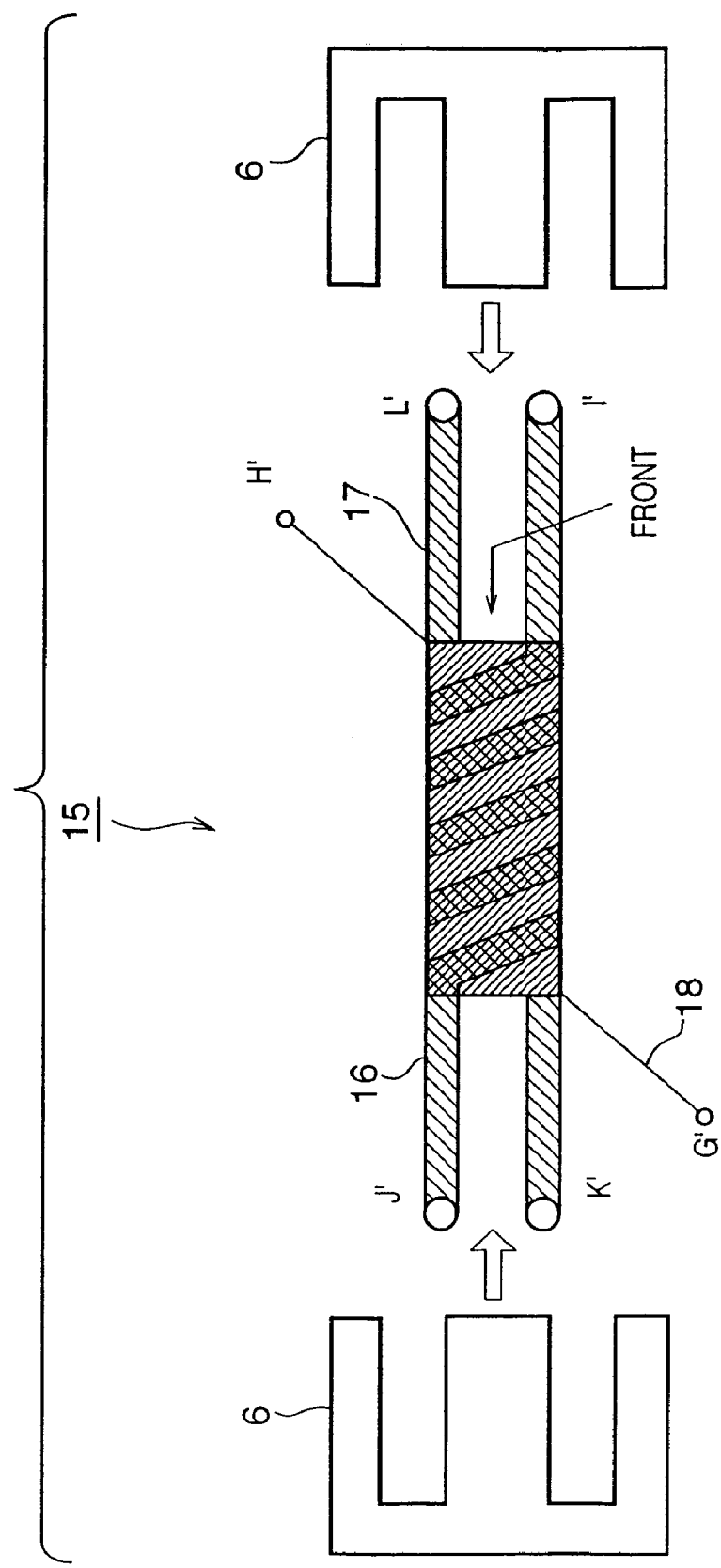
FIG. 23 is a top view of the transformer according to the third embodiment.

In the transformer 13 according to the second embodiment, first the coil 14 serving as the secondary coil is wound upon the core 40, and then the coils 8 and 9 serving as the primary coils are wound upon the coil 14, as illustrated in FIGS. 16 and 17. In the present embodiment, however, first the first coil 16 and second coil 17 serving as the primary coils are wound upon the core 40, and then the coil 18 serving as the secondary coil is wound upon wound upon the coils 16, 17, as illustrated in FIGS. 22 and 23.

Figure 21:
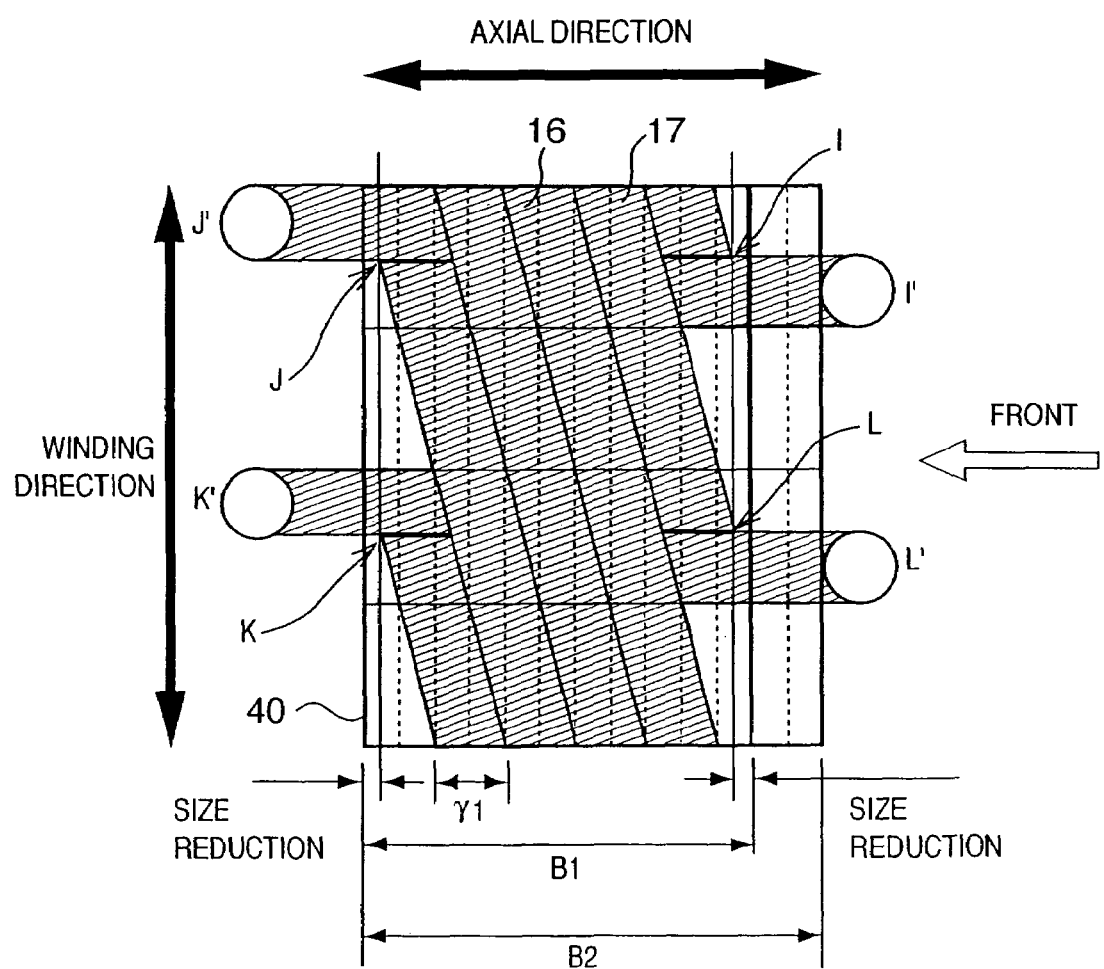
FIG. 21 is a schematic view illustrating a development of the surface of a core in the transformer according to the third embodiment.

FIG. 21 is a schematic view illustrating a development of the surface of the core 40. The area (and the leads of the terminals) on the surface of the core 40 occupied by the coils 16 and 17 are indicated by the darker areas. The method of winding the coils 16 and 17 of the transformer shown in FIG. 21 is similar to that of coils 8 and 9 shown in FIG. 13. However, the method differs in that the four coil ends (leads) are bent along the axial direction of the core 40 at points midway along each surface of the core.

Assume that winding starting positions and end position I, J, K, L of each of the coils shown in FIG. 21 correspond to C, D, E, F in FIG. 12, and that ends I', J', K', L' of each of the coils in 21 correspond to C', D', E', F' in FIG. 11.

A method of assembling the transformer of this embodiment will be described next. FIGS. 22 and 23 are top views of the transformer 15 useful in describing a method of assembly, in which FIG. 22 illustrates a state in which the coils 16 and 17 serving as the primary coils have been wound on the core 40, and FIG. 23 illustrates a state in which the coil 18 serving as the secondary coil has been wound on the coils 16 and 17 in FIG. 22. It should be noted that the ends of the coil 18 are represented by G' and H'.

Figure 24:
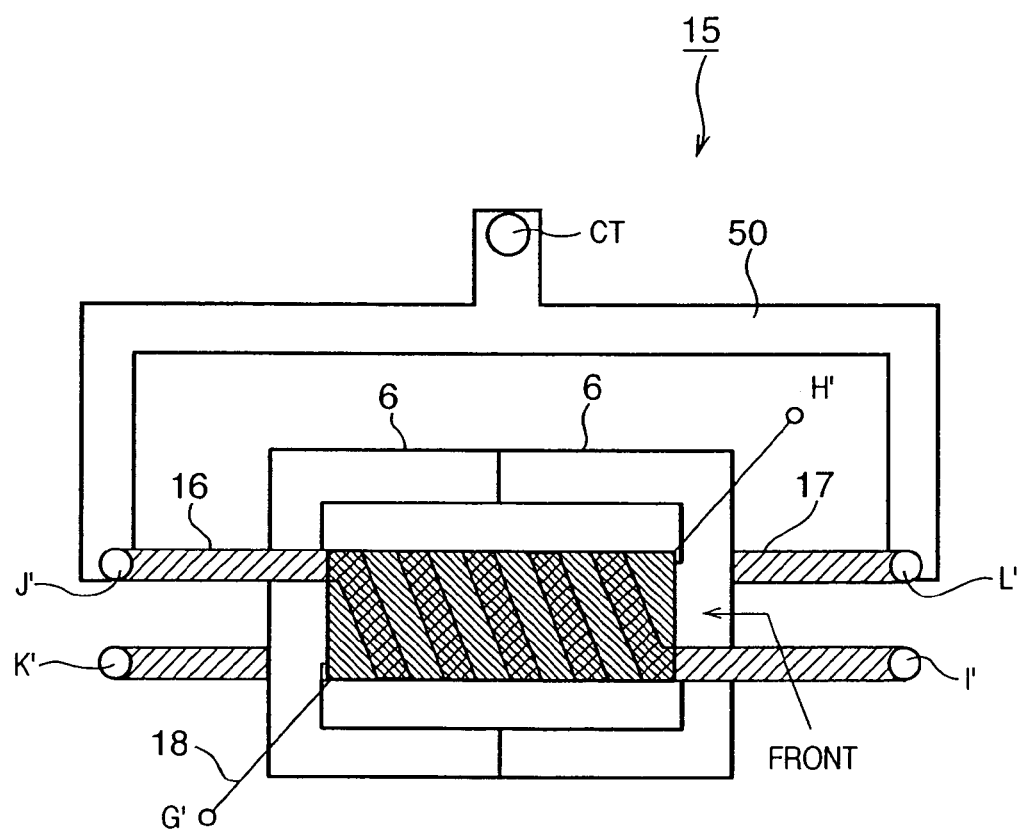
FIG. 24 is a top view illustrating the transformer of FIG. 23 in the assembled state.

FIG. 24 is a top view illustrating the transformer 15 completed by connecting the ends of each of the terminals in accordance with the circuit diagram of FIG. 20. The end J' of coil 16 and the end L' of coil 17 are connected by the bus bar 50.

Figure 25:
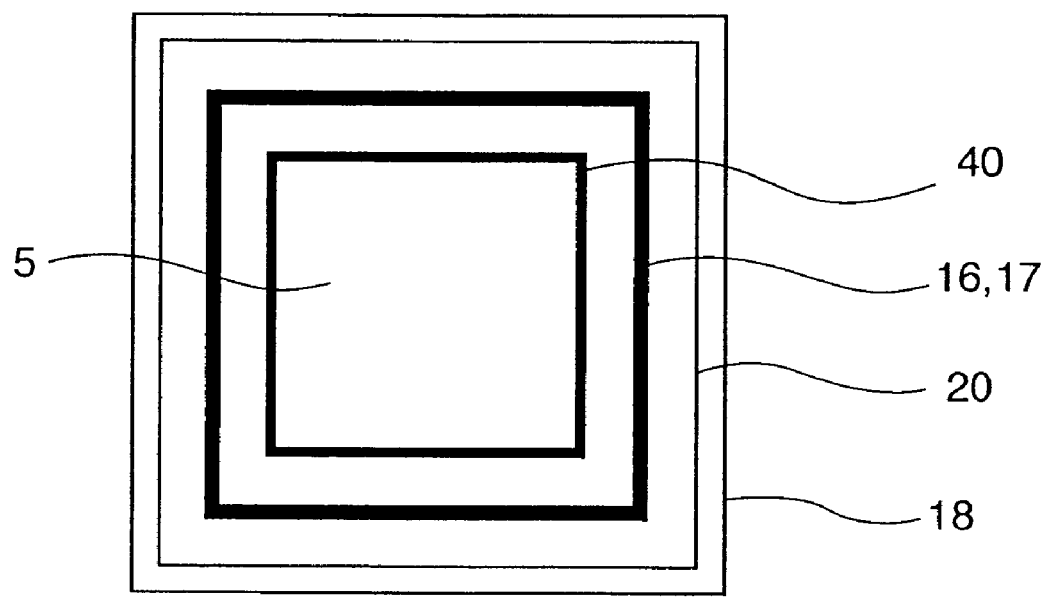
FIG. 25 is a sectional view in which coils in the transformer of the third embodiment are illustrated in a stacked state.

FIG. 25 is a sectional view of the transformer 15 and illustrates the placement of each coil. This illustrates a state in which the coils 16 and 17 serving as the primary coils, a film 20 and the coil 18 serving as the secondary coil have been stacked on the core 40 in the order mentioned. It should be noted that the cores 6 are not illustrated in FIG. 25.

Figure 26:
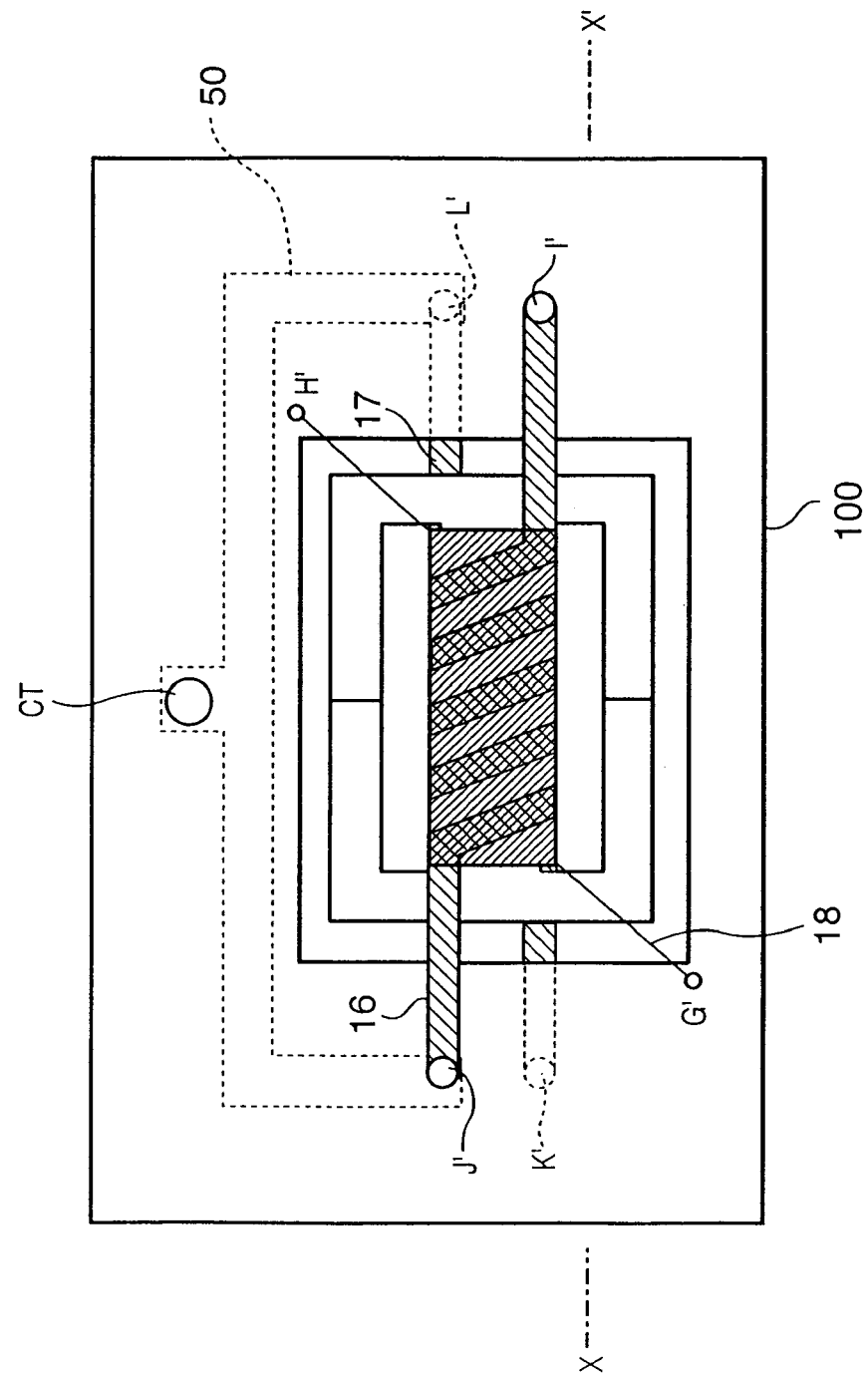
FIG. 26 is a diagram illustrating the transformer of the third embodiment in a state mounted on a printed circuit board.

FIG. 26 is a top view illustrating the transformer 15 of this embodiment mounted on a printed circuit board. A printed circuit board 100 is provided with a transformer insertion hole of a size larger than that of the cores 6, the transformer 15 is placed in the approximate center of the insertion hole, both ends I' and J' of coil 16 are placed on one side of the printed circuit board 100, and both ends K' and L' of coil 17 are placed on the other side of the printed circuit board 100. Further, in this embodiment, ends J' and L' are connected by the bus bar 50, which passes through the interior of the printed circuit board 100. However, the bus bar 50 may be replaced by through-holes and lands, etc., provided in the board in advance. Such an expedient simplifies the mounting process and lowers the cost of mounting.

Figure 27:
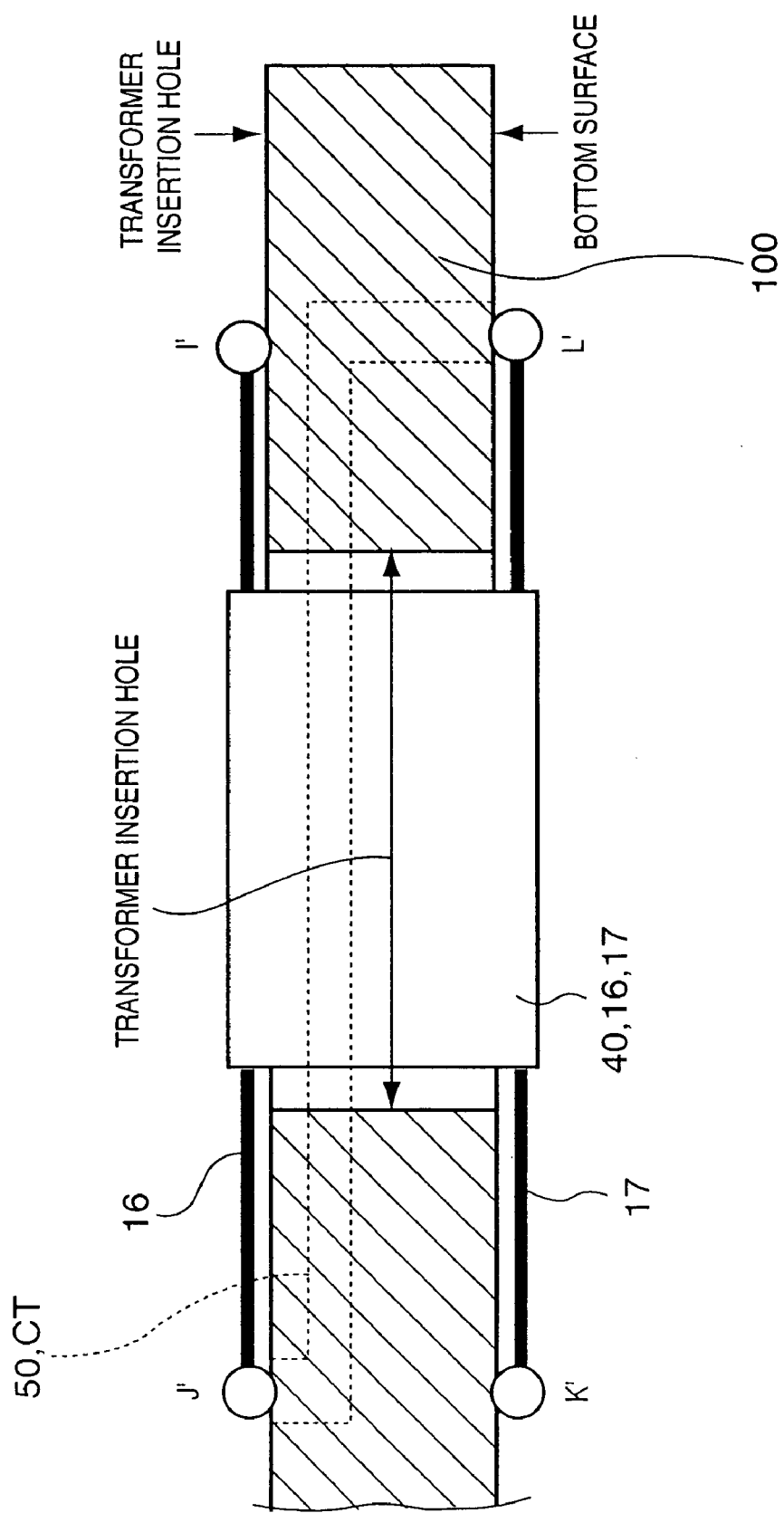
FIG. 27 is a sectional view illustrating the positional relationship between the transformer and printed circuit board of FIG. 26.

FIG. 27, which is a sectional view taken along line X-X' of FIG. 26, illustrates the positional relationship between the coil ends of the transformer 15 and the printed circuit board 100 on which the transformer 15 has been mounted. It is assumed that ends G' and H' of coil 18 are connected appropriately to lands provided on the printed circuit board 100. Further, the cores 6 are not illustrated in FIG. 27.

As described above, the transformer 15 of this embodiment is such that the coils 16 and 17 are bent at points midway along each surface of the core 40 and are led out as connection ends, as shown in FIG. 21. Accordingly, in comparison with the inductor of FIG. 12 of the first embodiment, in which the coils 8 and 9 occupy each surface of the core 40 up to the corners thereof, the length of the wire wound upon the core 40 is reduced.

As a result, the resistance values of the coils can be reduced and the winding-area width can be reduced in comparison with the inductor of FIG. 12. Further, since the bending direction of the coil ends is the axial direction of the core 40, the leads of the coils 16 and 17 extend in a direction different from the winding direction of the coil 18 and do not interfere when the coil 18 is wound. When the coil 18 is wound, therefore, it can be wound to the full winding-area width of the core 40. This makes it possible to improve the area factor of the coil 18.

Further, when the transformer of this embodiment is used in a push-pull circuit, the degree of coupling between primary-side windings, namely between the first and second coils, is improved. This has the effect of suppressing surge voltage when a switching element in the push-push circuit is switched. This improves the reliability of the circuit that uses the transformer.

Fourth Embodiment

An transformer 21 according to a fourth embodiment of the present invention will be described with reference to FIGS. 28 and 29.

The transformer according to this embodiment differs from the transformer of the third embodiment in terms of the method of extracting the ends of the primary coils. It should be noted that the transformer of this embodiment also is a transformer for a push-pull circuit and is similar to the transformer 15 of the third embodiment with regard to the circuit and structure used. A detail description of the circuit and structure, therefore, is omitted.

Figure 28:
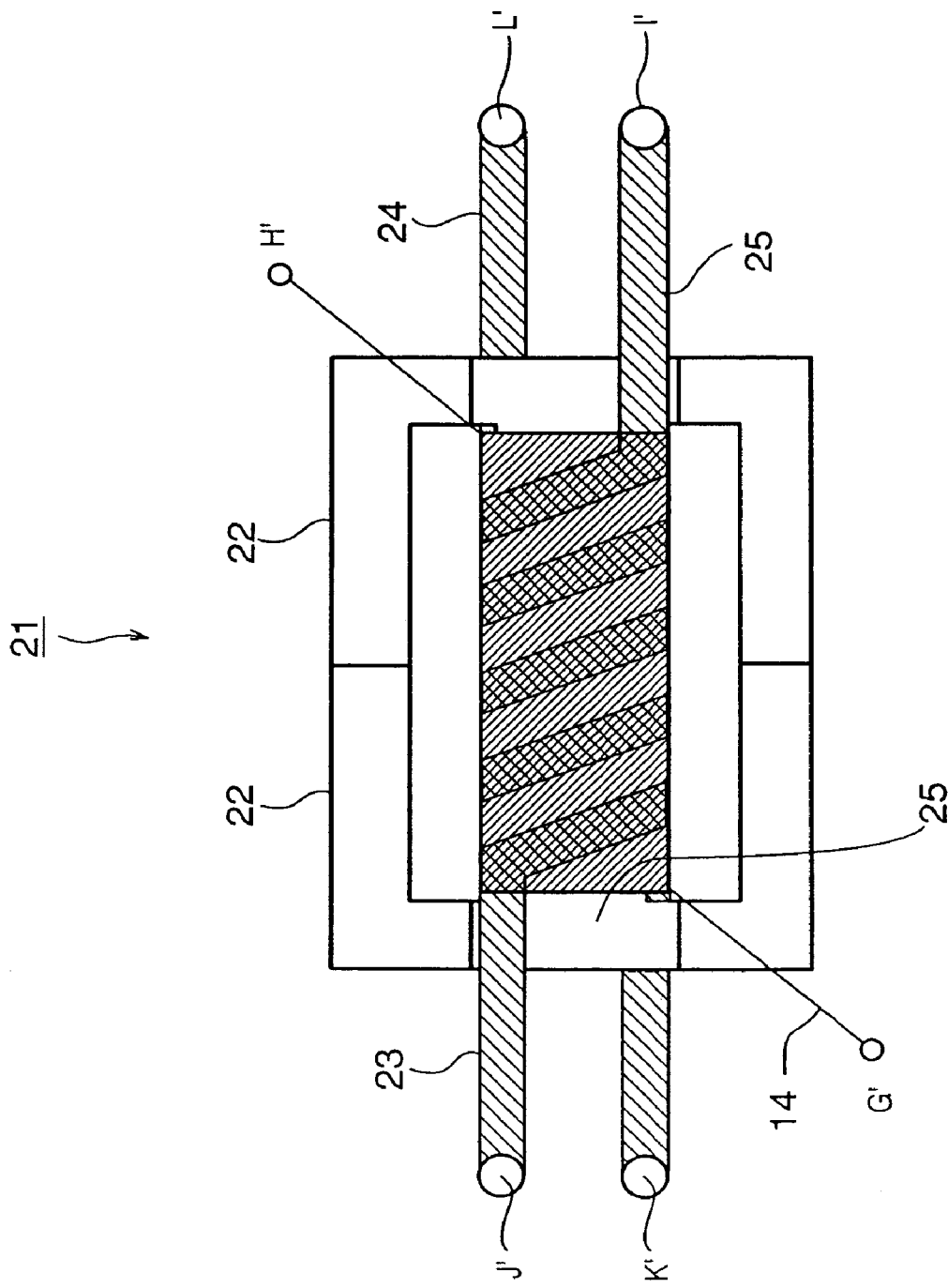
FIG. 28 is a top view of a transformer according to a fourth embodiment of the present invention.
Figure 29:
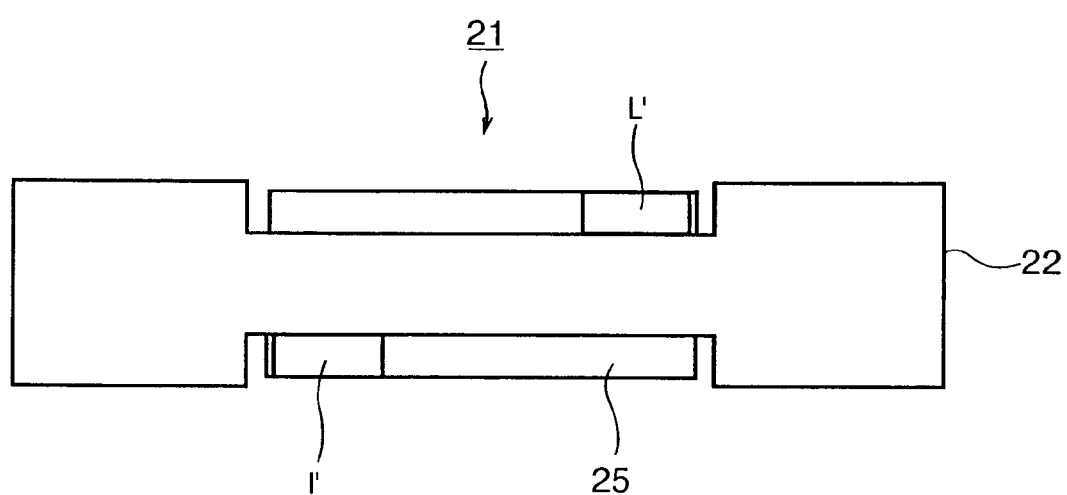
FIG. 29 is a side view of the transformer shown in FIG. 28.

FIG. 28 is a top view of the transformer 21 according to this embodiment, and FIG. 29 is a side view as seen from the side of ends I' and L' in FIG. 28. As illustrated, the transformer 21 of this embodiment is provided with cut-away portions on both sides of a core 22 in order to extract the ends of coils 23 and 24.

If this arrangement is adopted, the ends of the coils 23 and 24 can be led out from the cut-outs 25. As a result, the windings that construct the coils will not protrude from the core along the vertical direction thereof and the height of the transformer can be reduced.

Figure 30:
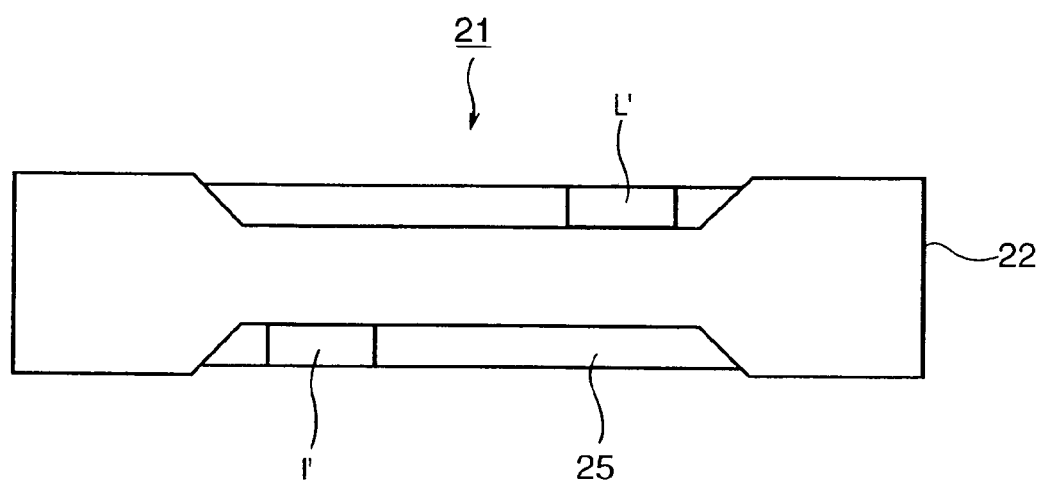
FIG. 30 is a side view illustrating a modification of the fourth embodiment.

Here the transformer core is provided with cut-away portions having the shape of a rectangular parallelepiped. However, as shown in FIG. 30, it is preferred that the core be provided with a cut-away portion 25 that is tapered so that the surfaces of the core are rendered smoothly continuous. This is preferred because it is possible to prevent concentration of magnetic flux at the corner portions.

Thus, in accordance with this embodiment, it is possible to reduce the size and, in particular, the height of a transformer and the device that uses the transformer.

Other Embodiments

In all of the embodiments described above, coils are constructed using a core. However, if the wire used in the primary coil has enough hardness for the wire to maintain its shape satisfactorily, a core will be unnecessary. This will make it possible to achieve a further reduction in cost and thickness.

Furthermore, the shape of the core and the shape of the coil wire used in the inductor or transformer are not limited to those illustrated in the above embodiments. Suitable core and wire shapes can be employed in accordance with the application and the mounting dimensions.

In addition, if the core is omitted as described above, a resistance value for a direct current can be reduced by reducing a length of the coil, since each coil can be wound in centralized form.

Further, the above embodiments have been described with regard to an example in which a transformer according to the invention is used in a push-pull circuit. However, a transformer or inductor according to the present invention can also be applied to other well-known circuits besides a push-pull circuit and is particularly ideal for use in a low-voltage, large-current circuit.

As many apparently widely different embodiments of the present invention can be made without departing from the spirit and scope thereof, it is to be understood that the invention is not limited to the specific embodiments thereof except as defined in the appended claims.

CLAIM OF PRIORITY

This application claims priority from Japanese Patent Application No. 2004-124564 filed Apr. 20, 2004, which is hereby incorporated by reference herein.

What is claimed is:

1. A printed circuit board on which an inductor has been mounted, said inductor comprising:

a core and first and second coils wound upon said core, wherein a wire constituting said first coil and a wire constituting said second coil are wound so as to lie parallel to each other and such that each contacts said core, a winding starting position of said first coil coincides with a winding starting position of said second coil along the axial direction of said core, and the winding starting positions of said first and second coils are on opposite sides about said core, and end portions of said first and second coils that have been led out to the same side in relation to the axial direction of said core are connected to different sides of front and back sides of said printed circuit board.

2. The printed circuit board according to claim 1, wherein end portions of said first and second coils that have been led out to the same side are connected internally of said printed circuit board.

3. A transformer comprising a core and first and second coils wound upon said core, wherein a wire constituting said first coil and a wire constituting said second coil are wound so as to lie parallel to each other and such that each contacts said core, a winding starting position of said first coil coincides with a winding starting position of said second coil along the axial direction of said core, and the winding starting positions of said first and second coils are on opposite sides about said core, and said first and second coils are connected serially and used as a primary-side coil.

4. A printed circuit board including a transformer comprising a core and first and second coils wound upon said core, wherein a wire constituting said first coil and a wire constituting said second coil are wound so as to lie parallel to each other and such that each contacts said core, a winding starting position of said first coil coincides with a winding starting position of said second coil along the axial direction of said core, and the winding starting positions of said first and second coils are on opposite sides about said core, end portions of said first and second coils that have been led out to the same side in relation to the axial direction of said core are connected to different sides of front and back sides of said printed circuit board, and end portions of said first and second coils that have been led out to the same side are connected internally of said printed circuit board.

* * * * *